(12) United States Patent
Rumbak

(10) Patent No.: US 10,449,865 B2
(45) Date of Patent: Oct. 22, 2019

(54) SYSTEM AND METHOD FOR POWERING ON-ROAD ELECTRIC VEHICLES VIA WIRELESS POWER TRANSFER

(71) Applicant: Electric Road Ltd., Jerusalem (IL)

(72) Inventor: Hanan Rumbak, Mazkeret Batya (IL)

(73) Assignee: Electric Road Ltd., Rosh Haain (IL)

( * ) Notice: Subject to any disclaimer, the term of this patent is extended or adjusted under 35 U.S.C. 154(b) by 354 days.

(21) Appl. No.: 15/198,844

(22) Filed: Jun. 30, 2016

(65) Prior Publication Data

US 2016/0339785 A1 Nov. 24, 2016

Related U.S. Application Data

(63) Continuation-in-part of application No. PCT/IL2014/051140, filed on Dec. 31, 2014.

(30) Foreign Application Priority Data

Dec. 31, 2013 (GB) ..................... 1323160

(51) Int. Cl.
*B60L 11/18* (2006.01)
*B60L 5/00* (2006.01)
(Continued)

(52) U.S. Cl.
CPC .............. *B60L 11/182* (2013.01); *B60L 5/005* (2013.01); *B60L 53/12* (2019.02); *B60M 3/06* (2013.01);
(Continued)

(58) Field of Classification Search
CPC ................ B60L 5/005; B60L 11/182
(Continued)

(56) References Cited

U.S. PATENT DOCUMENTS 5,821,728 A * 10/1998 Schwind ............... B60L 11/182
320/108
5,905,440 A 5/1999 Julian et al.
(Continued)

FOREIGN PATENT DOCUMENTS

CA 2935330 7/2015
CN 1738733 A 2/2006
(Continued)

OTHER PUBLICATIONS

International Search Report of PCT Application No. PCT/IL2014/051140 dated Jul. 5, 2015.
(Continued)

*Primary Examiner* — Zachary L Kuhfuss
(74) *Attorney, Agent, or Firm* — Pearl Cohen Zedek Latzer Baratz LLP

(57) ABSTRACT

A system for wireless power transfer of on-road vehicles is provided herein. The system includes a plurality of base stations; a power transmission line located beneath a surface of a road having a plurality of segments, each segment having at least one pair of coils and at least one capacitor electrically connected via a switch to the coils in the segment; and at least one vehicle having at least one power receiving segment having at least two coils, connected to at least one capacitor, wherein the at least one vehicle further includes a communication transmitter configured to transmit a power requesting signal, wherein the coils of the power transmitting segment are configured to receive the power requesting signal; and wherein each of the base stations is further configured to feed a plurality of the power transmitting segments with current at a resonance frequency, responsive to the power requesting signal.

13 Claims, 27 Drawing Sheets

(51) Int. Cl.
*B60M 3/06* (2006.01)
*B60M 7/00* (2006.01)
*H02J 50/12* (2016.01)
*H01F 38/14* (2006.01)
*H03H 7/38* (2006.01)
*B60L 53/12* (2019.01)

(52) U.S. Cl.
CPC ............ *B60M 7/003* (2013.01); *H01F 38/14* (2013.01); *H02J 50/12* (2016.02); *H03H 7/38* (2013.01); *B60L 2210/30* (2013.01); *Y02T 90/16* (2013.01)

(58) Field of Classification Search
USPC .......................................................... 191/10
See application file for complete search history.

(56) References Cited

U.S. PATENT DOCUMENTS

| | | | |
|---|---|---|---|
| 6,050,233 | A | 4/2000 | Vilou |
| 6,421,600 | B1 | 7/2002 | Ross |
| 2009/0045773 | A1 | 2/2009 | Pandya et al. |
| 2009/0108707 | A1 | 4/2009 | Mahoney et al. |
| 2011/0094075 | A1 | 4/2011 | Lee et al. |
| 2011/0184842 | A1 | 7/2011 | Melen |
| 2012/0025625 | A1* | 2/2012 | Jufer ............... B60L 11/005 307/104 |
| 2012/0217111 | A1* | 8/2012 | Boys ............... H01F 38/14 191/10 |
| 2012/0326498 | A1* | 12/2012 | Woronowicz ....... B60L 5/005 307/9.1 |
| 2013/0033229 | A1* | 2/2013 | Boyer ............... H02J 3/381 320/109 |
| 2015/0298559 | A1 | 10/2015 | Keeling et al. |

FOREIGN PATENT DOCUMENTS

| | | |
|---|---|---|
| CN | 102800496 A | 11/2012 |
| GB | 2476497 | 6/2011 |
| GB | 2496433 | 5/2013 |
| JP | 2005-528068 | 9/2005 |
| JP | 2011-121456 | 6/2011 |
| JP | 2011-135754 | 7/2011 |
| JP | 2011-160653 | 8/2011 |
| JP | 2012-157167 | 8/2012 |
| JP | 2013-051744 | 3/2013 |
| JP | 2013-515639 | 5/2013 |
| JP | 2013-188071 | 9/2013 |
| JP | 2013-247811 | 12/2013 |
| WO | WO 03/086807 | 10/2003 |
| WO | WO2013/042570 | 3/2013 |
| WO | WO 2013/068534 | 5/2013 |

OTHER PUBLICATIONS

Office Action of GB Application No. GB1323160.0 dated Feb. 7, 2014.
Office Action dated Apr. 27, 2018 for corresponding Chinese application No. 201480074444.8.
Office action dated Mar. 20, 2018 for corresponding Japanese application No. 2016-544552.
Office action dated Sep. 25, 2018 for corresponding Japanese application No. 2016-544552.
International Search Report dated Nov. 13, 2017 for corresponding PCT application No. PCT/IL2017/050724.
Japanese Office Action dated Jun. 25, 2019 for corresponding Japanese Application No. 2016-544552.

* cited by examiner

SYSTEM AND METHOD FOR POWERING ON-ROAD ELECTRIC VEHICLES VIA WIRELESS POWER TRANSFER

CROSS REFERENCE TO RELATED APPLICATIONS

This application is a Continuation-in-Part application of PCT Patent Application Number PCT/IL2014/051140 which was filed on Dec. 31, 2014 and claims priority from GB Patent Application No. GB1323160.0, filed on Dec. 31, 2013, both of which are incorporated herein by reference in their entirety.

FIELD OF THE INVENTION

The present invention relates generally to systems and methods of wireless power transfer, and in particular to such methods and system that power moving on-road vehicles.

BACKGROUND OF THE INVENTION

Prior to a short discussion of the related art being set forth, it may be helpful to set forth definitions of certain terms that will be used hereinafter.

The term "wireless power transfer" (WPT) (also known as power-over-the-air) refers herein to the transmission of electrical energy from a power source to an electrical, such as an electrical power grid or a consuming device, without the use of conductors. In wireless power transfer, a wireless transmitter connected to a power source conveys the field energy across an intervening space to one or more receivers, where it is converted back to an electrical current and then used. Wireless transmission is useful to power electrical devices in cases where interconnecting wires are inconvenient, hazardous, or are not possible. Wireless power techniques fall into two categories, non-radiative and radiative. In non-radiative techniques, power is typically transferred by magnetic fields using magnetic inductive coupling between coils of wire. Applications of this type include inductive powering of electric vehicles like trains or buses.

The term "power transmitter" refers herein to the infrastructure side of a WPT network. In inductory based WPT, the power transmitter includes the inductance circuitry. The term "power receiver" refers herein to the vehicle side of a WPT network.

The term "non-tracked vehicle" refers herein to on road vehicles that are not bound to moving along specific tracks, such as cars and buses, as opposed to ordinary and light trains.

Powering non-tracked vehicles over the air pose many challenges. Since a non-tracked vehicle can move lateral to the direction of advancement, there is a danger of the inductance circuits on the power transmitter side (road) and the inductance circuits on the power receiver side (vehicle) become non-overlapping and thus the WPT process becomes inefficient.

Another challenge is to deal with potential radiation hazards due to the coils positioned right under the road. Yet another challenge is to regulate the current supplied by the network to the vehicle despite a varying load. Unregulated current at the power receiver (vehicle) may lead to unlimited current and destruction of the power receiver circuits. It is also important to provide an efficient yet simple mechanism by which the power receiver (vehicle) requests energy from the power transmitter (road).

SUMMARY OF THE INVENTION

According to some embodiment of the present invention, a system for wirelessly powering on-road vehicles is provided herein. The system may include: a plurality of base stations configured to output an alternating current at a specified frequency; a power line located beneath a surface of a road and comprising a plurality of independently switched power transmitting segments each comprising at least one pair of coils connected electrically in series to at least one capacitor electrically and via a switch to one of the base stations, forming a switched power transmission inductance circuitry; and at least one vehicle having at least one power receiving segment having at least two coils and at least one capacitor forming a power receiving inductance circuitry, wherein the at least one vehicle further comprises a communication transmitter configured to transmit a power requesting signal, wherein the coils of the power transmitting segment are configured to receive said power requesting signal, wherein the base station associated with the coils of the power transmitting segment receiving said power requesting signal is further configured to feed said power transmitting segment with the alternating current at the specified frequency being a resonance frequency of said power transmission and receiving inductance circuitries, responsive to the power requesting signal.

According to some embodiments of the present invention, the coils of each pair of coils at the power transmitting segment are operating in opposite phases.

According to some embodiments of the present invention, the power request signal sent by the vehicle may include only detected whenever there is at least a partial overlap between the coils of the power transmit segment and the coils at the power receive segment.

According to some embodiments of the present invention, the power request signal may include detected by a current loop at a switch card associated with the base station, wherein upon detection of a current at the current loop, and subject to authorization by the base station, the bases station feeds the coils at the power transmitting segment.

According to some embodiments of the present invention, the power request signal may include configured to generate an alternating current at the current loop, and wherein the detection may include carried out by phase detection.

According to some embodiments of the present invention, the resonance frequency may be approximately 80 kHz to 100 kHz, and the power request signal may be at a frequency of approximately 400 kHz to 1000 khz.

According to some embodiments of the present invention, the vehicle may include auxiliary power receiving segments on both sides of the power receiving segment.

According to some embodiments of the present invention, the auxiliary power receiving segments may include oval or rectangular coils.

According to some embodiments of the present invention, the vehicle further may include an electrical motor and an impendence matching circuitry configured to receive the current from the power receiving inductance circuitry and deliver an impedance-matched current to the electrical motor.

According to some embodiments of the present invention, the vehicle may include a super capacitor wherein the impendence matching circuitry delivers the impedance-matched current to an electrical motor via the super capacitor.

According to some embodiments of the present invention, the vehicle may include a voltage regulator that prevents an output voltage at the electrical motor from exceeding a predefined value.

According to some embodiments of the present invention, the voltage regulator may include a circuit that senses a reference voltage over a predefined value and repeatedly discharges at least one capacitor until the reference voltage goes under the predefined value.

BRIEF DESCRIPTION OF THE DRAWINGS

Embodiments of the invention are illustrated by way of example and not limitation in the figures of the accompanying drawings, in which like reference numerals indicate corresponding, analogous or similar elements, and in which.

Figure 1A:
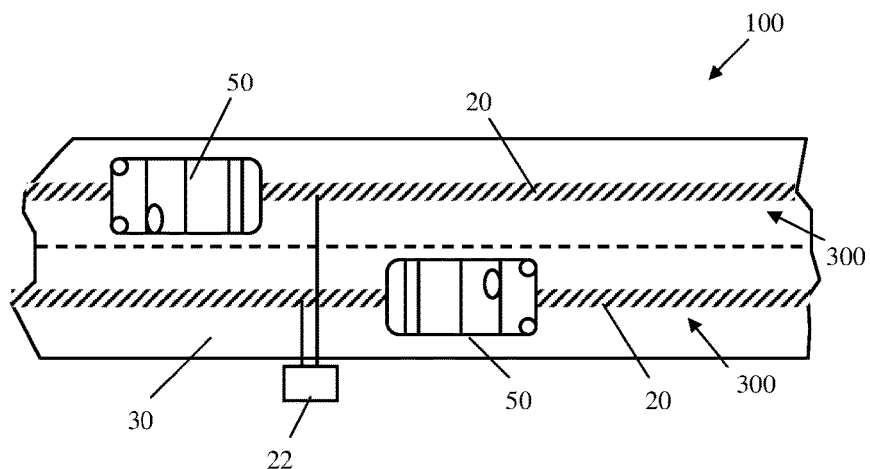
FIGS. 1A, 1B and 1C are schematic top view illustration and frontal cross-sectional view illustrations, respectively, of a system for powering an electric vehicle according to some embodiments of the present invention.

It will be appreciated that, for simplicity and clarity of illustration, elements shown in the figures have not necessarily been drawn accurately or to scale. For example, the dimensions of some of the elements may be exaggerated relative to other elements for clarity, or several physical components may be included in one functional block or element. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components, modules, units and/or circuits have not been described in detail so as not to obscure the invention.

A system and method for charging an electric vehicle on a road, according to some embodiments of the present invention, may enable powering a vehicle while moving on a road. Certain sections of a road may include a charge-inducing infrastructure, which may power a vehicle moving upon it. Thus, the vehicle's chargeable battery may be used for traveling in other road sections that does not include such infrastructure. For example, the size of the vehicle's chargeable battery, which may be used for traveling in other road sections, may be reduced, and/or longer journeys may be enabled. In road sections that include a charge-inducing infrastructure, the range of journey is substantially unlimited, at least from the aspect of power.

Figure 1B:
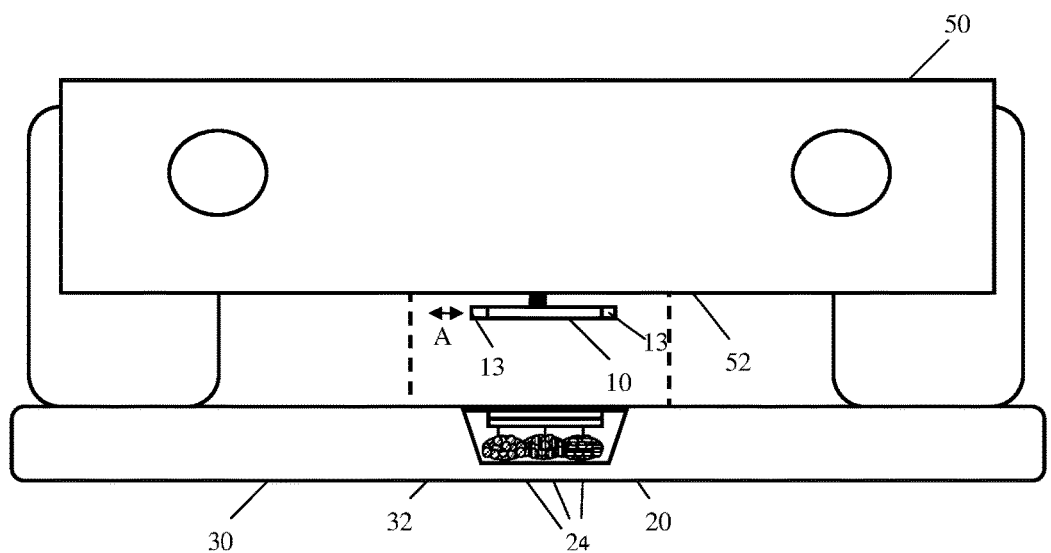
Figure 1C:
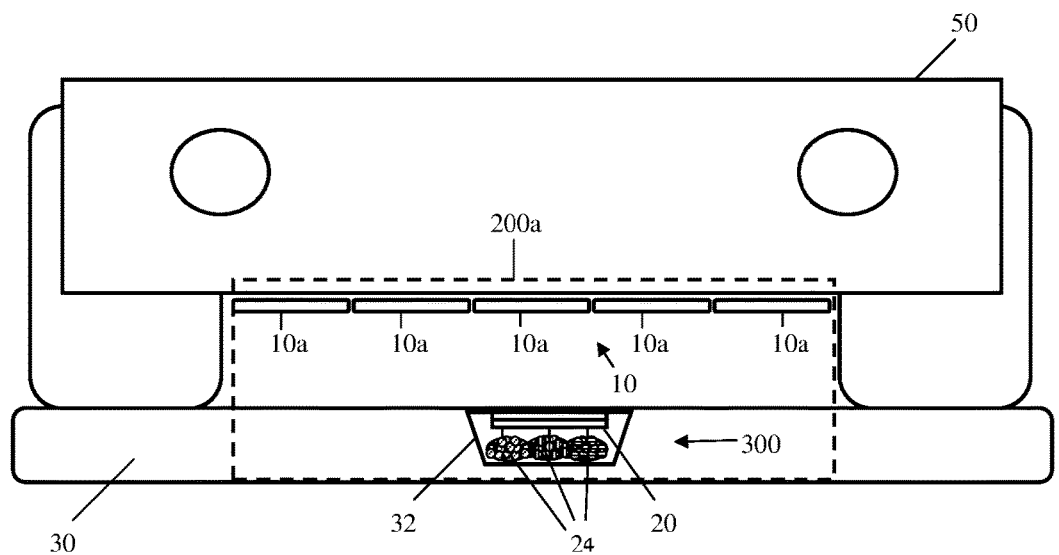
Figure 2A:
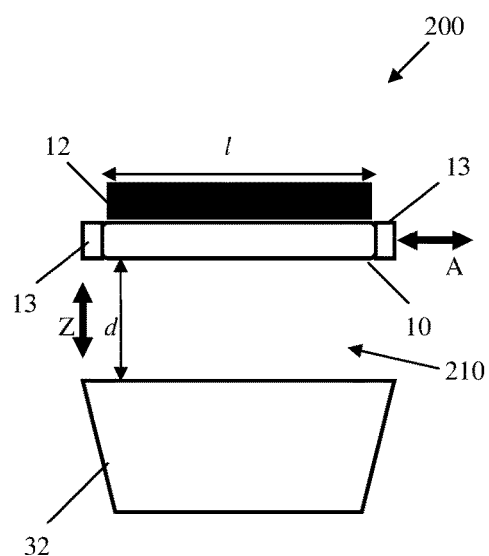
FIGS. 2A and 2B are cross-sectional schematic illustrations of an air-core transformer according to some embodiments of the present invention.

Reference is now made to FIGS. 1A, 1B and 1C, which are schematic top view illustration and frontal cross-sectional view illustrations, respectively, of a system 100 for powering an electric vehicle according to some embodiments of the present invention. System 100 includes at least one accumulator system 300 (described in more detail with reference to FIG. 5), two of which are shown in FIG. 1A. System 300 includes an inductive stripe or power transmission line 20, which may be placed on a road 30 or inside an excavated canal 32 in road 30, as shown in FIG. 1B. As shown in FIG. 2A, inductive stripe or power transmission line 20 may include and/or perform as a primary winding of an air-core transformer 200, wherein a secondary winding of transformer 200 may be a receiver array 10 installed at the vehicle underneath 52 of vehicle 50. Receiver array 10 may move from side to side along an axis A perpendicular to the driving direction of vehicle 50 on road 30, and/or to the longitudinal axis of power transmission line 20.

Two tracking coils 13 may be installed at two sides of receiver array 10, at the same distance from the center of receiver array 10 along axis A. Positioning of receiver array 10 by tracking coils 13 may be performed by a closed-loop control method as described herein. In order to receive power from power transmission line 20 efficiently, the center of receiver array 10 along axis A, i.e. the center of a coil 17 (shown in FIG. 3A) along axis A, should be positioned above the center of power transmission line 20, i.e., above the center of a coil 27 (shown in FIG. 3A) along axis A. Accordingly, when receiver array 10 is at the desired position above power transmission line 20 for efficient power transmission, two tracking coils 13 at respective two sides of receiver array 10 should be positioned at the same distance from the center of power transmission line 20 along axis A. While a guiding signal and/or powering signal is transmitted via an accumulator coil 27, as described in detail herein, voltage values may be measured at the outlets of tracking coils 13. When receiver array 10 and tracking coils 13 are shifted off the desirable position above power transmission line 20, different average energy values may be measured at the outlets of tracking coils 13. The difference between the average energy values at the two tracking coils 13 may be smaller as the shift from the desirable position above power transmission line 20 is smaller, and the average energy values at the two tracking coils 13 may be substantially identical when receiver array 10 and tracking coils 13 are positioned at the desired position.

In some other embodiments, as shown in FIG. 1C, receiver array 10 may include several receiver arrays 10a, which may obviate the need to move the receiver in order to receive the power from power transmission line 20. System 100 may further include a generator or converter 22 that may receive power from a general electricity network and provide the power required by power transmission line 20 in a respective road section. One generator or converter 22 may be allocated to a certain road section of between tens to hundreds of meters, depending on the number of lanes, the traffic load, the steepness of the road and/or any other parameter which may affect the power consumption of vehicles 50 and/or of converter 22.

According to some embodiments of the present invention, power transmission line 20 may include a multi-phase power system, which may operate with one or more phases. It will be appreciated that in the present description, multi-phase power may include any number of one or more phases, and may also refer, in some embodiments, to single-phase power. Accordingly, any multi-phase system or element described herein may be or include a system or element of any number of one or more phases.

As shown in more detail herein below, power transmission line 20 may include an array of accumulator units, wherein each unit may include a number of sets of accumulator loads, e.g., accumulator coils, according to the number of phases, each set of coils receiving AC power in a different phase shift. Accordingly, multi-phase power transmission line 20 may include a number of conductor groups 24 according to the number of phases, to receive multi-phase AC power from converter 22 via the corresponding multiple conductor groups 24.

Figure 2B:
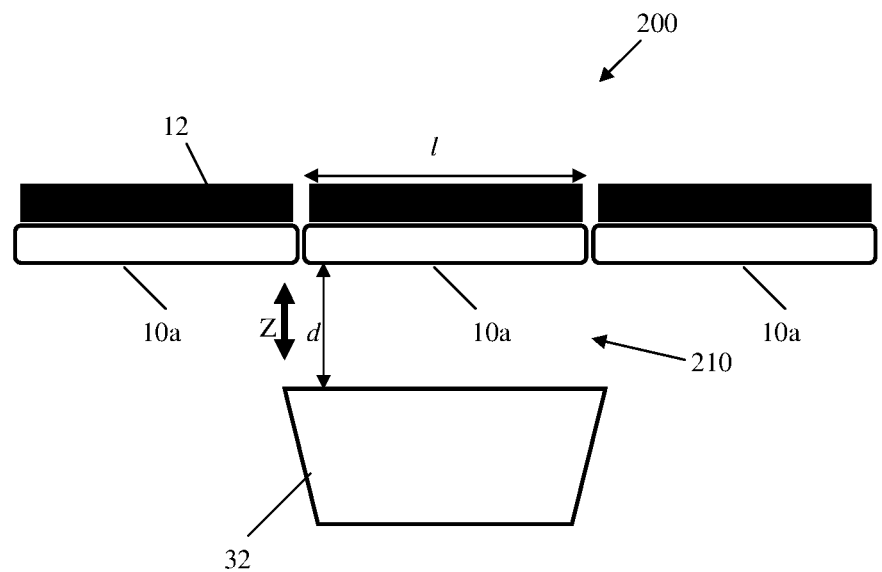

Reference is now made to FIGS. 2A and 2B, which are cross-sectional schematic illustrations of an air-core transformer 200 and 200a according to some embodiments of the present invention. Power transmission line 20 and receiver array 10 are shown. As shown in FIG. 2A, receiver array 10 may move from side to side along an axis A perpendicular to the driving direction of vehicle 50 on road 30, and/or to the longitudinal axis of inductive stripe 20, for example in order to be positioned in a desired location above power transmission line 20 according to signals measured at tracking coils 13. As shown in FIG. 2B, receiver array 10 may include in air-core transformer 200a several receiver arrays 10a, which may obviate the need to move the receiver in order to receive the power from power transmission line 20. The number of receivers along the width of vehicle 50 depends on the width of the vehicle.

As described in detail below, receiver array 10 or each of receiver arrays 10a may constitute an array of receiver units, e.g., assembled of receiver coils, which may receive power from corresponding accumulator coils. The width 1 of the work area, e.g. of each coil, of receiver array 10 or of each of receiver arrays 10a, should be the same as the width of power transmission line 20, e.g. the width of an accumulator coil.

The size of the air middle gap, i.e., air core 210 between power transmission line 20 and receiver array 10 may affect the ability of transformer 200 to transfer energy. As the distance d between power transmission line 20 and receiver array 10 is smaller, energy loses may be smaller. The distance d may change within a known range during the journey, for example, according to the bounces and/or the quality of the road, which may affect movements of receiver array 10 along axis Z. In some exemplary embodiments, the distance d between power transmission line 20 and receiver array 10 may be of up to about 20 cm, wherein the width 1 of receiver array 10, e.g. of a receiver coil, may be of up to about 40 cm. In order to neutralize the magnetic influences of the vehicle body, transformer 200 may include an insulator plate or plates 12 between receiver array 10 or receiver arrays 10*a* and the vehicle underside 52.

Power losses of transformer 200 may be caused by the resistance of the conductors, for example of the receiver and accumulator coils, and by the distance between power transmission line 20 and receiver array 10, which may depend, among other things, on the road conditions. The resistance of the coils may be reduced by using suitable Litz wires. Losses caused by the distance between power transmission line 20 and receiver array 10 may be smaller as the coils width is larger.

Additionally, a proximity effect may be created in the receiver and accumulator coils. The proximity between the wires in a coil may cause mutual swirl currents that may resist the current in the wires, especially at high frequencies. Embodiments of the present invention may include spiral Litz coils made of one layer, enabling law interaction between proximate wires, thus reducing the proximity effect and/or providing coils with high quality coefficient.

Transfer of energy may be provided, for example, when a receiver coil is located above an accumulator coil, thus creating a transformer. The positioning of receiver array 10 or receiver array 10*a* above power transmission line 20 may be performed automatically by a closed-loop control.

Figure 3A:
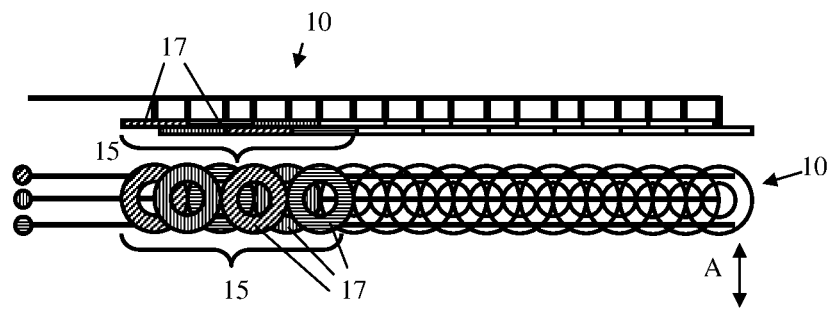
FIGS. 3A and 3B are side and beneath views of multi-phase receiver units in receiver arrays according to some embodiments of the present invention.
Figure 3B:
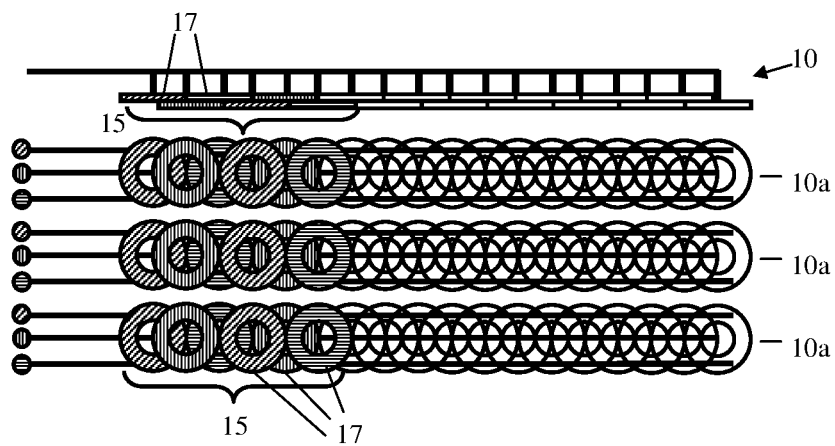

Reference is now made to FIGS. 3A and 3B, each showing side and bottom views of multi-phase receiver units 15 in receiver 10 or receiver arrays 10*a*, respectively, according to some embodiments of the present invention. The number of cells or coils 17 in a receiver unit 15 depends on the power required by the vehicle. A multi-phase receiver 15, as included in typical embodiments of the present invention, may include at least a number of coils 17 corresponding to the number of phases the system operates with, or any other multiple of this number. In an arrangement as shown in FIGS. 1C, 2B and 3B, the number of receiver arrays 10*a* depends on the structure and width of the vehicle.

Figure 4:
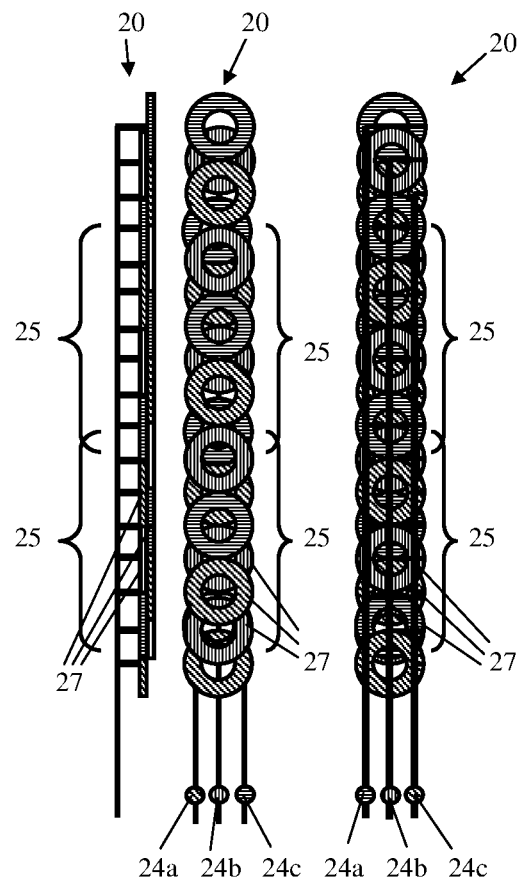
FIG. 4 is a schematic illustration of side, top and beneath view of a multi-phase power transmission line, according to some embodiments of the present invention.

Reference is now made to FIG. 4, which is a schematic illustration of side, top and bottom view of multi-phase power transmission line 20, according to some embodiments of the present invention. Power transmission line 20 may be formed of segments of a few tens of meters. Each segment may constitute a few sections 25 of about one meter. Each section 25 may be powered separately by a corresponding multi-phase power generator such as generator 22. Each section 25 may include a number of accumulator loads, e.g. accumulator coils 27, according to the number of phases or another multiple of this number. For example, a three-phase power transmission line 20 may be powered by a corresponding three-phase power generator such as generator 22. Accordingly, each section 25 may include three accumulator loads, e.g. accumulator coils 27, or another multiple of three, such as six accumulator loads. In the example of FIGS. 4-7, a three-phase configuration is shown, although the invention is not limited in that respect. The embodiments shown in FIGS. 4-7 may operate with any other number of phases of power. Accordingly, whenever the description mentions three elements or multiple of three elements that correspond to the three phases of power, it may be replaced with another number of system elements according to the number of phases the system operates with, or a multiple of this number, respectively.

As shown in FIG. 4, coils 27 are assembled with at least partial overlap one upon the other, and/or connected by a triangle connection. The direction of the windings in coils 27 in each section may be the same and thus the magnetic field may have the same phase along each section 25. Coils 27 may include three groups of coils, the coils in each group receive AC power with the same phase shift and may be connected in parallel to each other. Each group may receive AC power with a different phase shift from generator 22. The power may be received via three groups of conductors 24*a*, 24*b* and 24*c*, corresponding to the three groups of coils (or another number of groups according to the number of phases), each group of conductors conducting AC power with a different phase shift from generator 22, so that each of the three (or another number of) groups of coils receives power from another one of the three groups of conductors transmitting power with a particular phase shift. Each section 25 may include one coil of each group of coils, so that each section 25 constitutes a three-phase load in the present example.

According to one embodiment of the present invention, in a three-phase configuration, each section 25 may include three coils, for example with the same current direction in all three coils 27, which may be arranged with a partial overlap one over the other. A schematic illustration of the electrical arrangement of such three-coil section is shown in FIG. 6A.

According to further embodiment of the present invention, in a three-phase configuration, each section 25 may include six coils 27, for example with alternating current directions. The six coils may be arranged, for example so that each coil 27 overlaps half of a next coil 27. Two overlapping coils 27 in this arrangement may have opposite current directions. This arrangement may be more expensive. However, it may provide a more magnetic flux and more uniform and intense power. In both embodiments the overlap regime between coils 27, e.g., the positioning and measure of overlap, and the overlap regime between receiver coils 17, is substantially identical. A schematic illustration of the electrical arrangement of such six-coil section 27 is shown in FIG. 6B.

Figure 5:
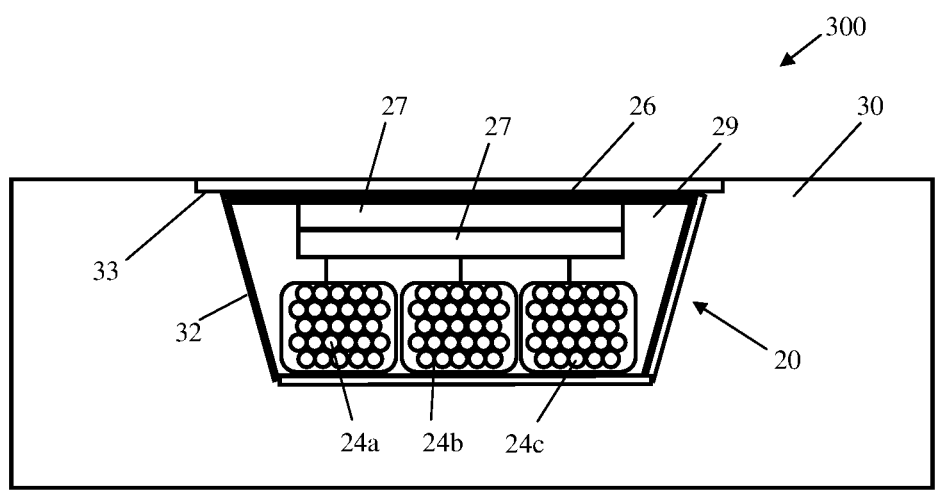
FIG. 5 is a schematic cross-sectional illustration of an accumulator system according to some embodiments of the present invention.

Reference is now made to FIG. 5, which is a schematic cross-sectional illustration of an accumulator system 300 according to some embodiments of the present invention. Accumulator system 300 may include power transmission line 20 embedded in road 30. Power transmission line 20 may be placed within a canal 32 in road 30. Power transmission line 20 may include three groups of conductors 24*a*, 24*b* and 24*c* and coils 27 arranged with at least partial overlap one over another. Within canal 32, accumulator system 300 may include insulator casting 29 to insulate power transmission line 20, for example from all sides except the top of coils 27, for example, in order to enable power transmission line 20 to transfer power via the top of coils 27 exclusively. Accumulator system 300 may further include, for example, an adhesive layer 26, to attach a layer 33 of stones or asphalt upon power transmission line 20.

Figure 6A:
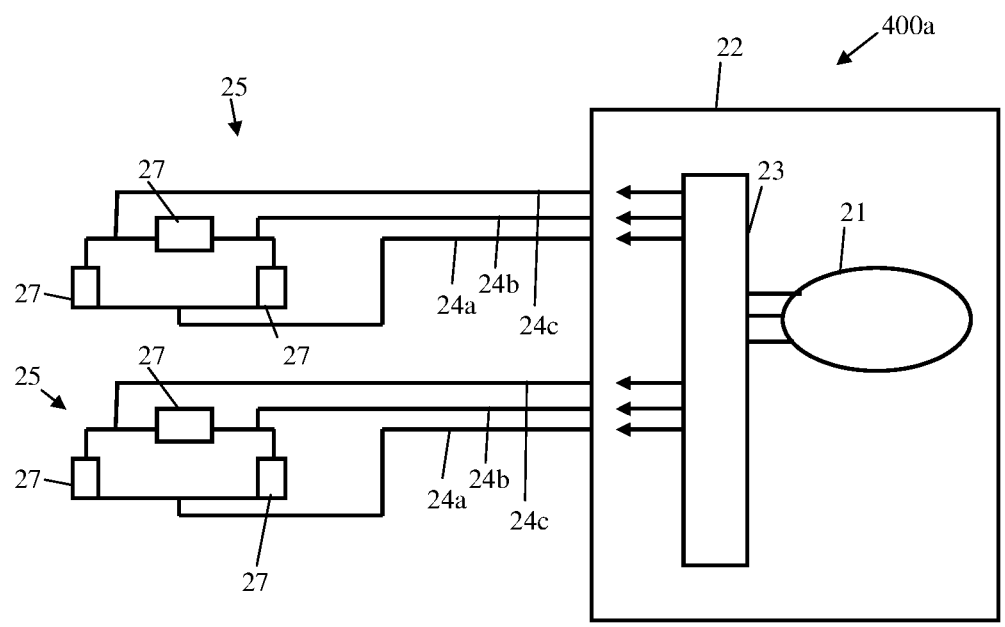
FIGS. 6A-6D are schematic illustrations of electrical arrangements of a three-coil section and of a six-coil section, respectively, according to some embodiments of the present invention.
Figure 6B:
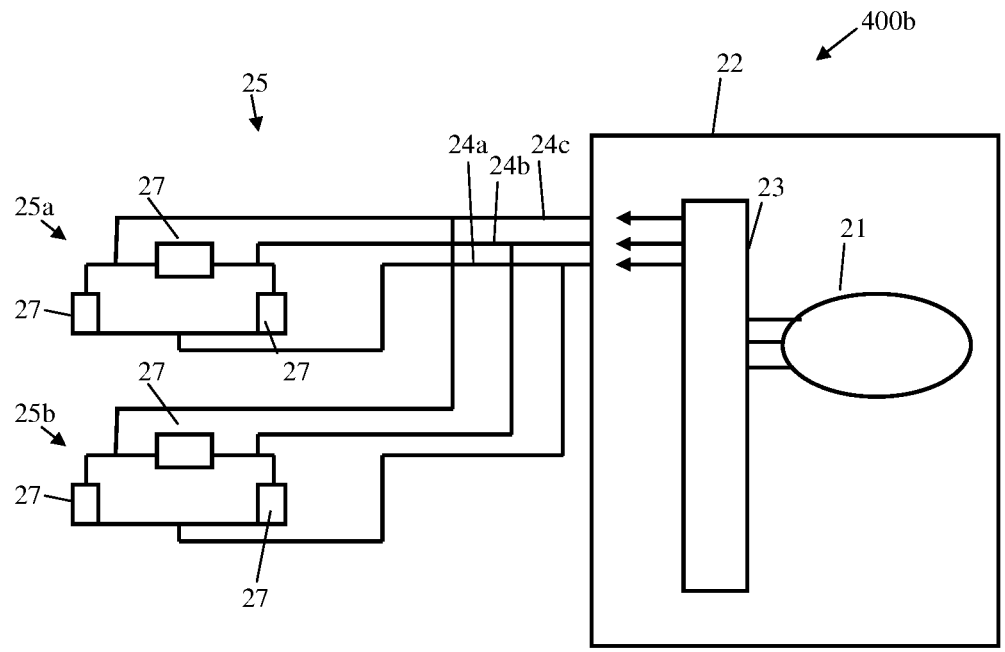
Figure 6C:
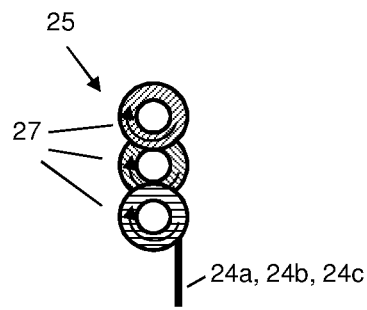
Figure 6D:
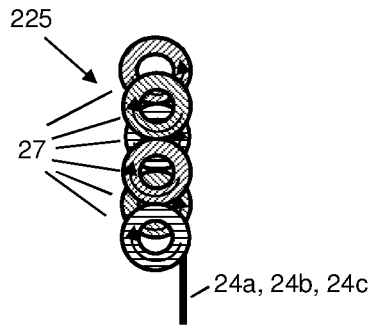

Reference is now made to FIGS. 6A, 6B, 6C and 6D. FIGS. 6A and 6B are schematic illustrations of electrical arrangements 400*a* and 400*b* of a three-coil section 25 and of a six-coil section 225, respectively. FIGS. 6C and 6D are top view of a three-coil section 25 and of a six-coil section 225, respectively. Each of electrical arrangements 400*a* and 400*b* may include a generator 22, which may include a three-phase inverter 21, which may invert, for example, single-phase alternating power received from a general electricity network to three-phase power, e.g., to three power transmissions, each with a different phase shift. Alternatively, generator 22 may receive power from a three-phase central electricity network. Additionally, generator 22 may include an adaptor 23 that may route the three-phase power to the three groups of conductors 24*a*, 24*b* and 24*c*, so that each group of conductors conducting power with a different phase shift. In FIG. 6A, the three coils 27 in each section 25 may have the same current direction, as shown in FIG. 6C. In FIG. 6B, the three coils 27 in section 25a may have the same current direction, while the three coils 27 in section 25b may have the same current direction, opposite to the current direction in section 25a, as shown in FIG. 6D. The three coils 27 in each of sections 25a or 25b are connected by a triangle connection, and receiving the three-phase power via the three groups of conductors 24a, 24b and 24c.

Figure 7:
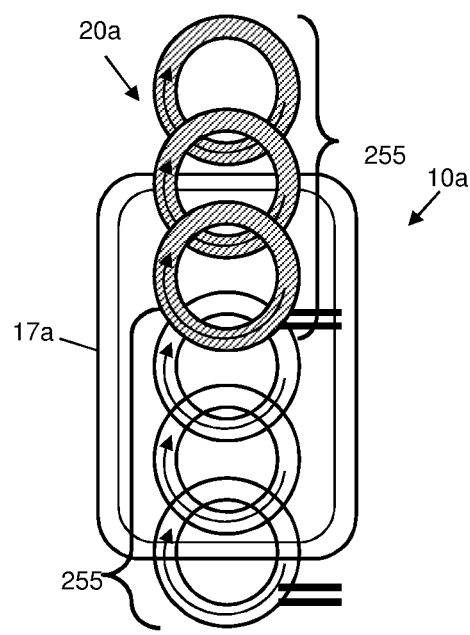
FIG. 7 is an underneath view schematic illustration of a single-phase receiver and a single-phase accumulator according to some embodiments of the present invention, which may replace the receiver and accumulator in some embodiments of the present invention.

In some embodiments of the present invention, a single-phase configuration may be used. Reference is now made to FIG. 7, which is an underneath view schematic illustration of a single-phase receiver array 10a and a single-phase power transmission line 20a according to some embodiments of the present invention, which may replace receiver array 10 and power transmission line 20 in some embodiments of the present invention described herein. Single-phase receiver array 10a may include one or more single receiver coils 17a, each constituting a receiver unit 15 by itself. Power transmission line 20 may include single phase-accumulator sections 255, which may replace accumulator sections 25 in some embodiments of the present invention described herein, each may include a number of accumulator coils, for example three coils as shown in FIG. 7. The width of a single receiver coil 17 may conform to the width of the entire accumulator section 25. Each accumulator section 25 may include the number of accumulator coils connected in parallel and may have two outlet conductors. This arrangement may reduce the receiver costs. Additionally, because of the large size receiver coil 17a, the power reception may be less sensitive to the positioning of receiver array 10 along axis A and along axis Z.

Figure 8:
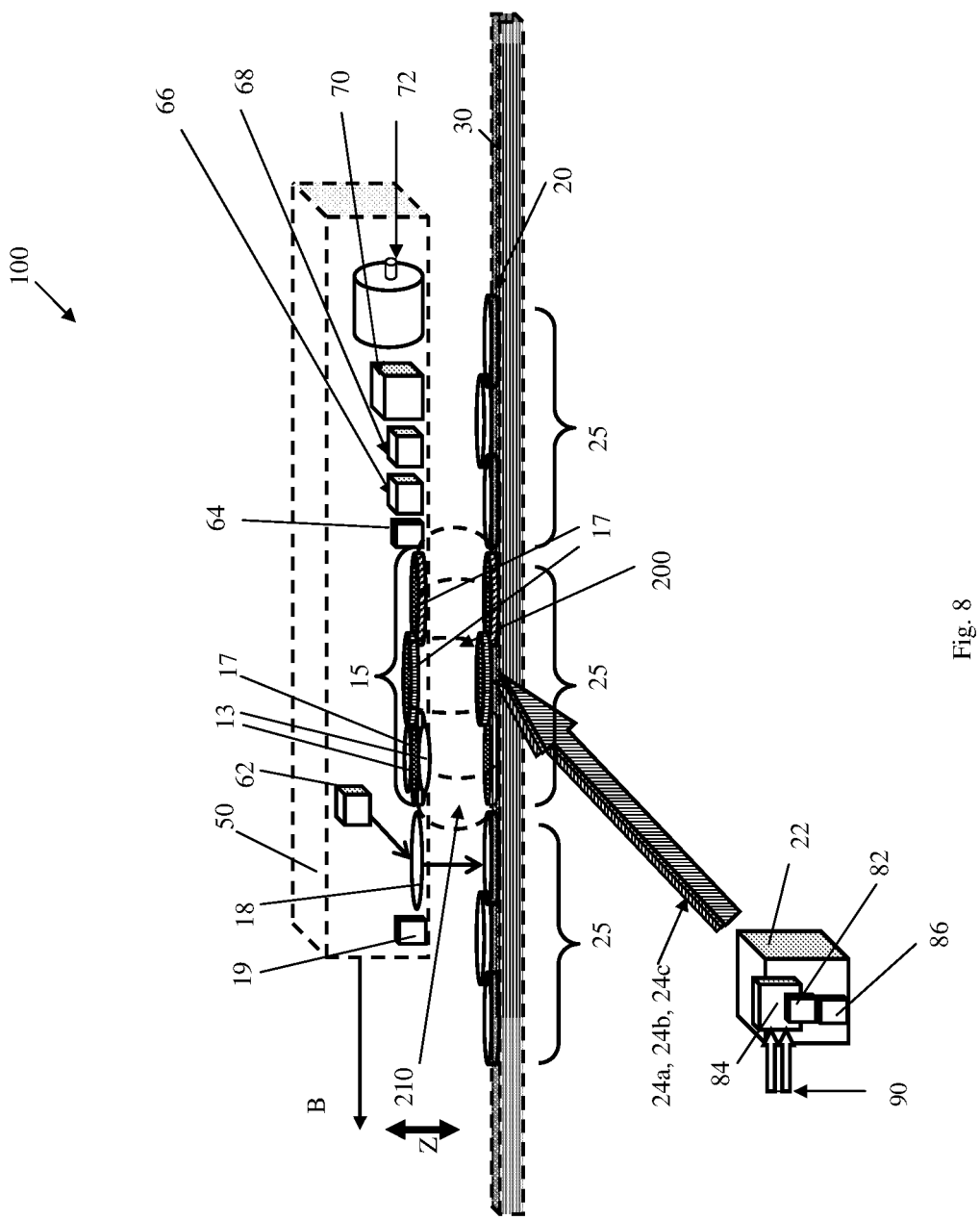
FIG. 8 is a more detailed side cross-sectional illustration of a system for powering an electric vehicle 50 according to some embodiments of the present invention.

Reference is now made to FIG. 8, which is a more detailed side cross-sectional illustration of a system 100 for powering an electric vehicle 50 according to some embodiments of the present invention. System 100 may include power transmission line 20 including sections 25, on or within road 30. System 100 may further include generator 22, coordination capacitors 84, communications unit 82, three-phase power supply 90, and three groups of conductors 24a, 24b and 24c as described in detail herein. System 100 may further include, installed in vehicle 50, a receiver array 10 including at least two tracking coils 13, at least one three-phase receiver 15, an accelerometer 19 and a communications coil 18. Additionally, system 100 may include, installed in vehicle 50, coordination capacitors 64, communications unit 62, diode-bridge 66, super-capacitor 68, accumulator 70 and engine/inverter 72. Accelerometer 19 may detect movements of receiver array 10 along axis Z.

The power received by receiver array 10 may be converted to DC power and may be transmitted to accumulator 70 which may store some energy, and to engine/inverter 72, which may drive the car. Accumulator 70 in car 50 may be used as backup energy source, for example when there is no sufficient and/or available accumulator infrastructure in the road, or when the car deviates from a lane. In some embodiments, the power provided by power transmission line 20 in the road may not suffice for riding on an ascending road, and the additional energy needed may be provided by accumulator 70.

Super capacitor 68 may enable aggregation of significant amount of energy in relatively short time. Super capacitor 68 may aggregate power when the vehicle decreases its velocity. For example, super capacitor 68 may aggregate all the energy released during sudden breaking of vehicle 50 from velocity of 100 KM/h. Super capacitor 68 may store energy aggregated during breaking of vehicle 50. The energy stored in super capacitor 68 may be utilized, for example, in situations when supplementary energy is required. For example, energy stored in super capacitor 68 may be utilized for acceleration of vehicle 50. In some embodiments of the present invention, excess energy may be returned back via receiver array 10 to power transmission line 20 and then back to a general electricity system or to generator 22, for example to power other vehicles on power transmission line 20, to provide power to road lights, and/or for any other suitable use.

In order to enable positioning of receiver array 10 relative to power transmission line 20, for example in axis A perpendicular to the driving direction, generator 22 may produce and/or transmit via power transmission line 20 a guiding signal. The production and/or transmission of the guiding signal may be performed before full initiation of generator 22 and/or full transmission of power by generator 22. For example, a designated generator of low power may constantly operate in the background and transmit the guiding signal, synchronized with generator 22 signaling, via the corresponding section 25. In another embodiment, generator 22 may include a switch 86 that may change the mode of operation of generator 22 from full transmission mode to guiding signaling mode, for example when no receiver is detected above the accumulator coils, and from guiding signaling mode to full transmission mode, for example, when receiver array 10 is detected above the accumulator coil. For example, before initiation of full power transmission to receiver array 10, the current from generator 22 may be provided to section 25 via a reactive component, such as, for example, a coil with at least ten times the inductance of a coil 27, or a capacitor small enough in order to avoid a resonance frequency of power transmission line 20. An AC switch 86 may short the reactive component when required, e.g., when receiver array 10 is properly located and may receive power according to some embodiments of the present invention, so that the power from generator 22 may be transmitted to section 25 and induced to receiver array 10 without the impedance of the reactive component. Full initiation of generator 22 and/or full power transmission by generator 22 means that generator 22 transmits power for powering vehicle 50, as opposed to the law-power guiding signal described herein, which is transmitted for initial positioning of receiver array 10.

The guiding signal may be received via two or more tracking coils 13, which may be located at the sides of receiver array 10. The guiding signal may be received by tracking coils 13 via a corresponding accumulator coil 27, and may be used for positioning of receiver array 10 above power transmission line 20 according to some embodiments of the present invention. Once receiver array 10 is positioned above power transmission line 20 in a sufficiently accurate manner, identification signal may be sent to communications unit 82, for example via communication coil 18.

For example, when the average energy values are the same at the two tracking coils 13, i.e., when receiver array 10 is positioned in the desired position above power transmission line 20 for efficient power transmission, communications unit 62 may transmit an identification signal to power transmission line 20 via communications coil 18 in order to initialize the power transmission, as described in detail herein.

Communications coil 18 may be located at the front of the receiver array 10 in the driving direction B of the vehicle. Communications coil 18 may enable communications with generator 22 and/or with an operator of system 100. For example, identification may be required for identification of the vehicle, debiting of a subscriber and initiation of the generator.

Communications coil 18 may be attached in the front of receiver array 10 in the driving direction B as shown in FIG. 8. Communications coil 18 may have, for example, two windings. Communications coil 18 may work with modulation frequency of about 1-10 MHz. An identification signal may be transmitted by communication unit 62 via communication coil 18 and induced to accumulator coils 27 and received by communication unit 82 in generator 22, and may be transmitted further to signal processing. In case the identification signal from communications coil 18 is identified, the relevant section 25 may be operated and become the operative section 25, e.g. the section 25 above which a corresponding section 15 is located, for example by a corresponding AC switch 86 as described above, and may transmit power by inductance to section 15. This may happen when a section 15 is above a section 25 and a transformer 200 is formed of an accumulator coil 27 and a receiver coil 17. Additionally, an adjacent section 25, e.g., the next section 25 in the driving direction B of vehicle 50 may also be operated, in order to be ready to transmit power to receiver array 10 when section 15 reaches a location above the next section 25. Therefore, two sections 25 are operated once an identification signal from communications coil 18 is identified. As vehicle 50 progresses in direction B, a section 25 may cease receiving and/or inducing full power, e.g. except a guiding signal, once there is no recognition of a receiver section 15 above the section 25. For example, the ceasing may be performed by the corresponding AC switch 86 as described above, which may open the short circuit, thus only low power guiding signal from generator 22 may be transmitted to section 25, via the reactive component. The recognition of whether a receiver section 15 is above the section 25, may be performed by checking the current through the section 25, which typically will have a different form when inducing power to receiver array 10 and when not. Once the section 15 is identified by the next section 25, the next section 25 becomes the operative section, and the section 25 after the operative section 25 in the driving direction may also be initiated as discussed, and so on.

When the air core 210 between receiver array 10 and power transmission line 20 is relatively large, e.g., distance d between power transmission line 20 and receiver array 10 is greater than a quarter of width 1, the power loses may be high. In order to overcome the high power loses and make the power transmission more efficient, receiver array 10 may operate in resonance, for example following the frequency dictated by generator 22. In order to raise the efficiency of power transmission, power transmission line 20 may work in sub-resonance. For example, a capacitor 84 may be connected in series to a section 25, which may have a greater capacity than required for having the same resonance frequency of receiver array 10. Thus, for example, the resonance frequency of power transmission line 20 may be smaller than, for example 80 percent of, the resonance frequency of receiver array 10. A magnetic field in a coil develops proportionally to the current intensity and to the number of windings. In order to create a sufficiently intense magnetic field, the inductance of the coil may be increased by increasing the number of windings, which may require increase of the voltage. Additionally, this may require very thin coil wires, while the insulation may have to be thick. Alternatively, in order to create a sufficiently intense magnetic field, the current may be increased by increasing the width of the coil wires. However, working with high current may require thick conductors which may increase the costs of the system. Working in resonance in transformer 200, for example by addition of suitable capacitors in series to power transmission line 20 and/or receiver array 10, may create very high intensity currents and, therefore, the magnetic field may increase dramatically as well, while the system may become unstable and hard to control. However, working in sub-resonance state in power transmission line 20 may increase the current and the magnetic field while increasing the efficiency. Therefore, a suitable capacitor 84 should be inserted in order to keep the system stable.

The distance between receiver array 10 and power transmission line 20 may change during the travel, which may affect changes in the mutual coupling coefficient of air transformer 200. Changes in the coupling coefficient may affect the resonance frequency. Accordingly, a smaller distance d between receiver array 10 and power transmission line 20, may increase the resonance frequency of transformer 200 and a larger distance d may decrease the resonance frequency of transformer 200, e.g., relative to the operation resonance frequency of receiver array 10. A horizontal movement of receiver array 10 relative to power transmission line 20 may also decrease the resonance frequency of transformer 200, e.g., relative to the operation resonance frequency of receiver array 10. These changes in the resonance frequency of transformer 200 relative to the operation resonance frequency of receiver array 10 may decrease the power transmission via transformer 200.

Figure 9A:
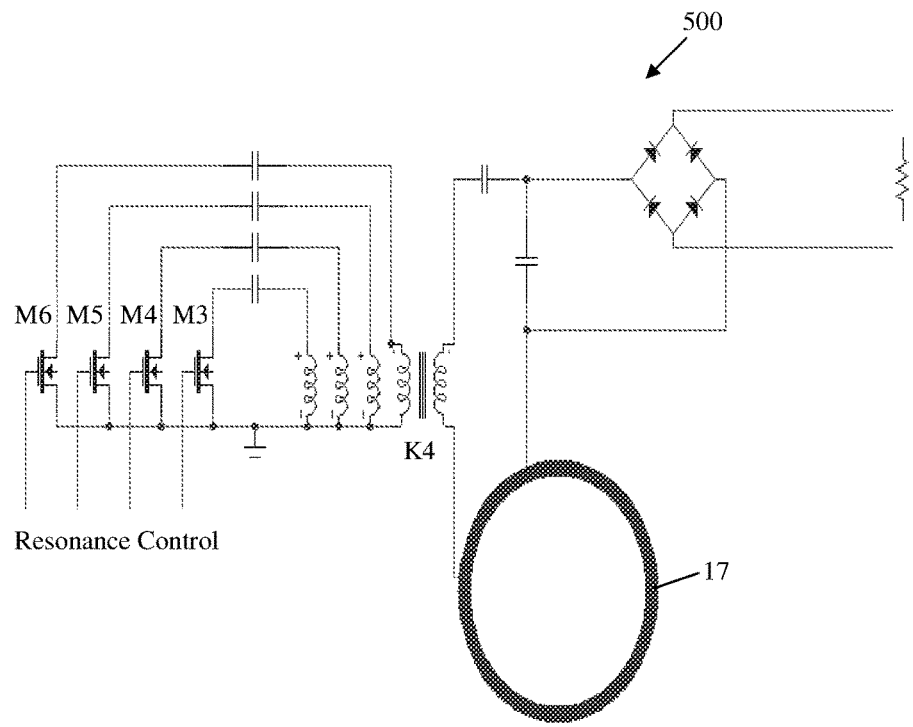
FIG. 9A is a schematic illustration of a circuit for changing the inductance of the receiver according to some embodiments of the present invention.

Some embodiments of the present invention provide solutions to changing road conditions to prevent and/or moderate the decrease in the power transmission because of changes in the resonance frequency. In order to maximize the power transmission, the inductance of receiver array 10 may be changed by a regulation circuit 500 shown in FIG. 9A. Transformer K4 may add inductance of up to 1 percent to coil 17 of receiver array 10. The inductance addition may decrease the resonance frequency of receiver coil 17. Switches M3 to M7 may connect or disconnect inductors, thus adding or subtracting inductance values to or from the inductance of transformer K4. Therefore, the resonance frequency of coil 17 may be controlled and/or regulated to conform to the resonance frequency of transformer 200 and/or the frequency of power transmission line 20.

Additionally, receiver array 10 may include an accelerometer 19 (shown in FIG. 8) that may detect changes in height, e.g. vertical movements, e.g. movements toward the ground (along axis Z), in real time during travel. Two tracking coils 13 described above may detect in real time shifts of the receiver, e.g., horizontal movements of receiver array 10 relative to power transmission line 20. When such movements are detected, the resonance frequency of coil 17 may be controlled, calibrated and/or regulated by circuit 500 as described herein.

Figure 9B:
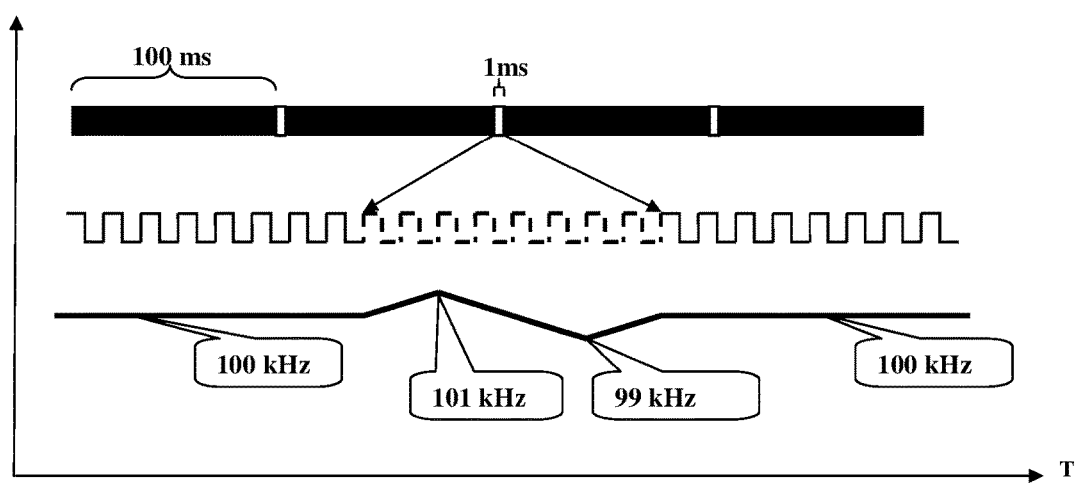
FIG. 9B is a graph illustration showing the frequency of the accumulator changes in a known range of modulation frequency, in known periods of time, in a known time window, according to some embodiments of the present invention.

In some embodiments of the present invention, the calibration of the resonance frequency of coil 17 may be performed by the frequency of power transmission line 20. In known periods of time, in a known time window, the frequency of power transmission line 20 may be changed in a known range of modulation frequency. For example, as shown in FIG. 9B, the accumulator frequency may change every 100 ms, in a 1 ms time window, from 100 kHz to 101 kHz, from 101 kHz to 99 kHz and from 99 kHz back to 100 kHz. During this time window of 1 ms, receiver array 10 may be calibrated to the optimal frequency resulting in maximal energy transmission, by adding/subtracting inductance by circuit 500 as described above, according to the difference between the operation resonance frequency of receiver array 10 and the optimal frequency. This calibration may hold until the next time window of 1 ms.

Each generator 22 may account for a certain segment of the road of a few tens of meters, for example up to about hundred meters. Such segment may include tens of sections 25, for example, the length of each may be of about one meter. Each generator 22 may be required to generate at least 100 KW, for example for a bi-directional, four lanes road segment, on which about ten cars are moving at a given moment at about 100 km/h, each car requiring about 10 KW. The generator may provide a square or sinus wave at about 400 KHz or less and alternating voltage of about 1000 v or less.

A breaking vehicle, i.e., a vehicle which decreases its velocity, may operate as a generator and may provide power to the power transmission line 20, for example in case its own accumulator 70 is full. When vehicle 50 decreases its velocity, the excess power may be provided back to accumulator coils 27. This may be an efficient arrangement, wherein vehicles moving down the road may provide power to the vehicles moving up the road, thus less total energy may be consumed from generator 22. An accumulator section 25 without a receiver section 15 above it, which may constitute a transformer without a load, may consume substantially no energy except occasional loses and the guiding signal. Additionally, for safety reasons, an accumulator section 25 may be operated, e.g., receive full power from generator 22, only when a corresponding receiver section 15 is located over it. In case of a resonance when receiver coils 17 are above the corresponding accumulator coils 27, high intensity currents and strong magnetic fields may develop. However, these magnetic fields become negligible in a distance of about 20 cm from the operative section 25.

In order to connect to the power transmission line 20, e.g., communicate with and identified by communications unit 82, the vehicle must move while power transmission line 20 is between the wheels. The exact positioning of the receiver array 10, i.e., by moving receiver array 10 along axis A perpendicular to the driving direction, may be performed automatically and dynamically. In case of a receiver array 10 including several receiver arrays 10a, the transmission between power transmission line 20 and receiver array 10 may be performed continuously.

Figure 10:
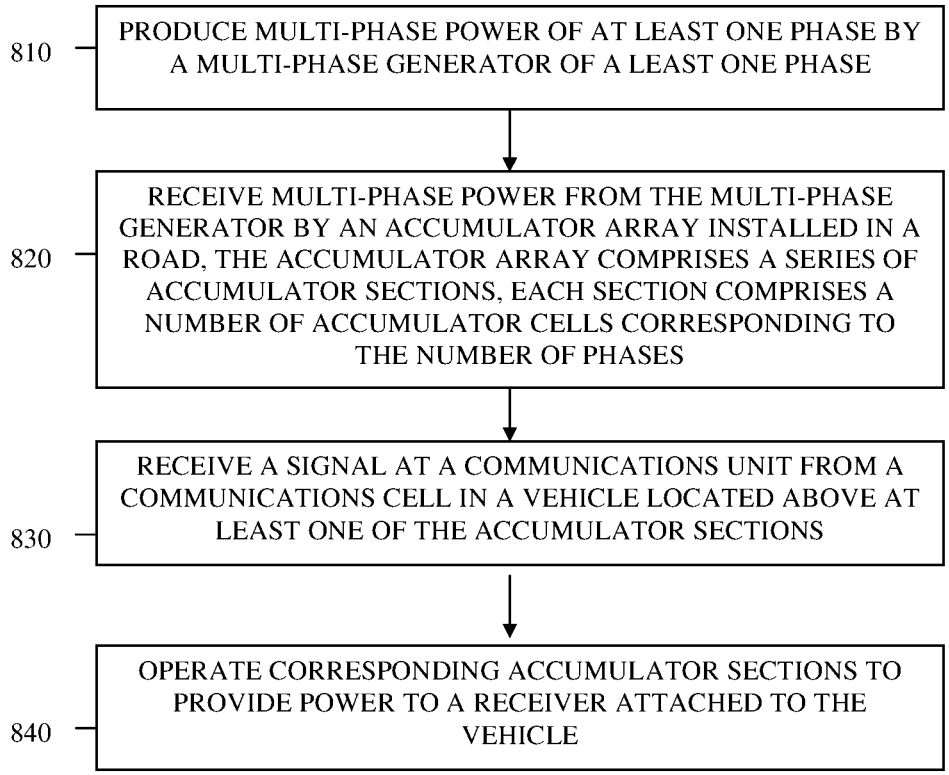
FIG. 10 is a schematic flow-chart illustration of a method for powering a vehicle on a road according to some embodiments of the present invention.

Reference is now made to FIG. 10, which is a schematic flow-chart illustration of a method for powering a vehicle on a road according to some embodiments of the present invention. As indicated in block 810, the method may include producing multi-phase power of at least one phase by a multi-phase generator of a least one phase. As indicated in block 820, the method may include receiving multi-phase power from the multi-phase generator by an power transmission line installed in a road, the power transmission line includes a series of accumulator sections, each section includes at least a number of accumulator coils corresponding to the number of phases, and each of the coils may be configured to receive power with a different phase shift. The method may further include carrying the power by a number of groups of conductors corresponding to the number of phases, each group carrying power with a different phase shift from the multi-phase generator to the power transmission line. As indicated in block 830, the method may include receiving a signal at a communications unit from a communications coil in a vehicle located above at least one of the accumulator sections. As indicated in block 840, the method may include operating corresponding accumulator sections to provide power to a receiver attached to the vehicle.

In some embodiments, the method may further include providing by the generator a guiding signal to be transmitted to the receiver at the vehicle via the accumulator.

In some embodiments, the method may further include operating by the communications unit a next accumulator section in the driving direction of the vehicle, before the receiver at the vehicle reaches a location above the next section.

In some embodiments, the method may further include ceasing of transmitting full power by the generator to a specific accumulator section once there is no recognition of a receiver above the specific section.

In some embodiments, the method may further include powering each accumulator section separately by a corresponding multi-phase power generator.

In some embodiments, the method may further include changing the mode of operation of the generator by a switch from full transmission mode to guiding signaling mode when no receiver is detected above the accumulator coils, and vice versa when the receiver is detected above the accumulator coils.

Figure 11:
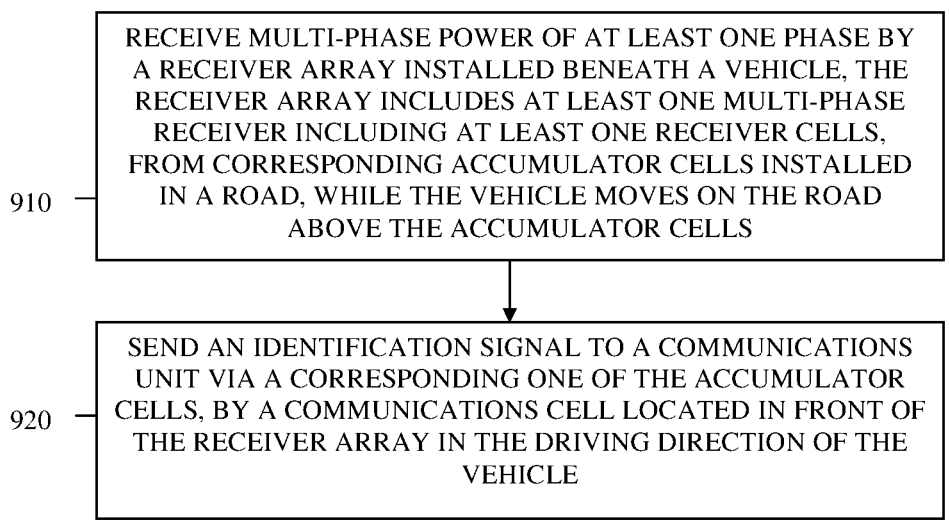
FIG. 11 is a schematic flow-chart illustration of a method for powering a vehicle on a road according to some embodiments of the present invention.

Reference is now made to FIG. 11, which is a schematic flow-chart illustration of a method for powering a vehicle on a road according to some embodiments of the present invention. As indicated in block 910, the method may include receiving multi-phase power of at least one phase by a receiver array installed beneath a vehicle, the receiver array includes at least one multi-phase receiver including at least a number of receiver coils corresponding to the number of phases, for example at least one receiver coils, from corresponding accumulator coils installed in a road, while the vehicle moves on the road above the accumulator coils.

As indicated in block 920, the method may include sending an identification signal to a communications unit via a corresponding one of the accumulator coils, by a communications coil located in front of the receiver array in the driving direction of the vehicle.

In some embodiments, the method may further include receiving by each of the receiver coils power with a different phase shift from a corresponding accumulator coil.

In some embodiments, the method may further include receiving, by at least two tracking coils at two sides of at least one of the multi-phase receivers, positioned in equal distances from the center of the at least one of the multi-phase receivers, a guiding signal via a corresponding one of the accumulator coils, and positioning the receiver array above the accumulator coils according to average energy measured at least two tracking coils.

In some embodiments, the method may further include providing by the receiver array excess power back to the accumulator coils when the vehicle decreases its velocity.

In some embodiments, the method may further include aggregating power by a super capacitor when the vehicle decreases its velocity.

In some embodiments, the method may further include changing by a regulation circuit the inductance of each of the receiver coils to conform to the resonance frequency the accumulator section by a regulation circuit, the regulation circuit including a transformer to add inductance to the receiver coil and switches to connect or disconnect inductors to change inductance values of the transformer.

In some embodiments, the method may further include detecting in real time vertical and horizontal movements of the receiver array, wherein said regulation circuit may regulate the resonance frequency of the receiver coil when movements are detected.

Power transmission line 20 may receive power from a central power system and return power from system 100 to the central power system, such as the national and/or local power system. As discussed in detail herein, each receiver coil 17 may be configured to receive power from a corresponding accumulator coil 27 while vehicle 50 moves on the road above corresponding accumulator coil 27, and further to provide excess power back to power transmission line 20. The excess power may be returned to the central power system and/or be provided to other vehicles by power transmission line 20. Therefore, power transmission line 20 may perform as an energy source as well as an energy accumulator. As such, for example, accumulator 20 may be required to fulfill radiation safety requirements.

Reference is now made to FIGS. 12A-12D, which are top views of power transmission line segments 227 or 227a, according to some embodiments of the present invention. Power transmission line segments 227 or 227a may be suitable for a one-phase configuration of embodiments of the present invention, i.e., coils 27 of power transmission line segment 227 or 227a may receive power at the same phase. Power transmission line segment 227, i.e., a segment of power transmission line 20, may include four coils in some exemplary embodiments. In some other exemplary embodiments, the segment may include two coils as in segment 227a shown in FIG. 12C. In other embodiments, power transmission line segment 227 may include any other suitable number of coils. In some embodiments of the present invention, two adjacent accumulator coils 27 may have opposite current direction, as shown by arrows w and w' in FIGS. 12A-12D. According to some embodiments of the present invention, an arrangement where two adjacent accumulator coils 27 have opposite current direction may facilitate significant reduction of radiation from power transmission line 20 and thus a safer system 100.

By having two adjacent accumulator coils 27 that have opposite current direction, the magnetic fields 260 created by the two adjacent coils 27 may fade each other as the distance Dm from the longitudinal axis of power transmission line 20 is greater outside the area of power transmission line 20. This fading may not harm the energy transfer from power transmission line 20 to receiver array 10 and from receiver array 10 to power transmission line 20. Therefore, in such embodiments, each two adjacent coils 27 may fade the magnetic fields of each other. One problem that may occur in such arrangement is that the energy transfer may be uneven, with intensity drops 265 at the transition areas between two adjacent coils 27, for example where two adjacent coils 27 meet. In some embodiments of the present invention, in order to overcome these intensity drops, a capacitor may be installed in connection to receiver array 117 (not shown), for example, a supercapacitor, that may smooth and mediate the power received from power transmission line 20.

Figure 12A:
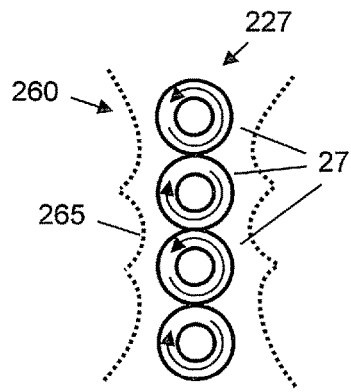
FIGS. 12A-12D are top views of power transmission line segments according to some embodiments of the present invention.
Figure 12B:
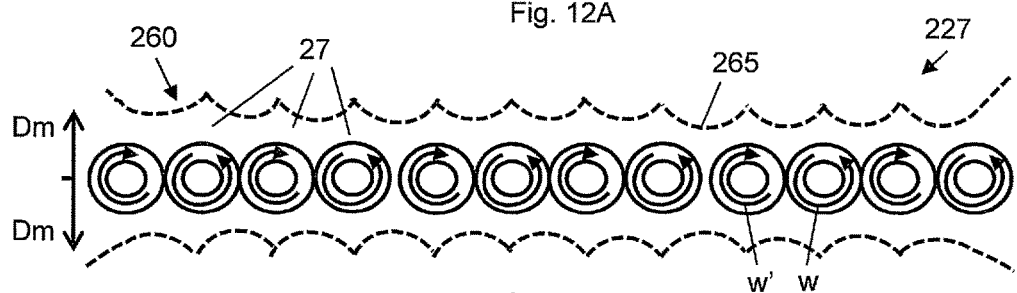
Figure 12C:
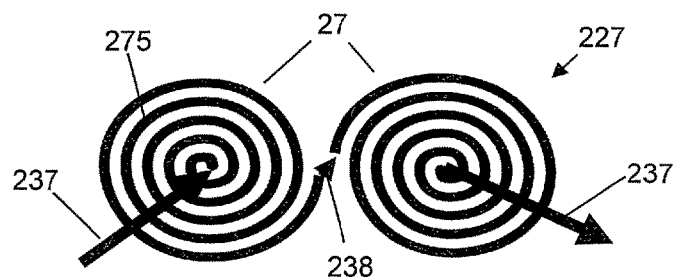
Figure 12D:
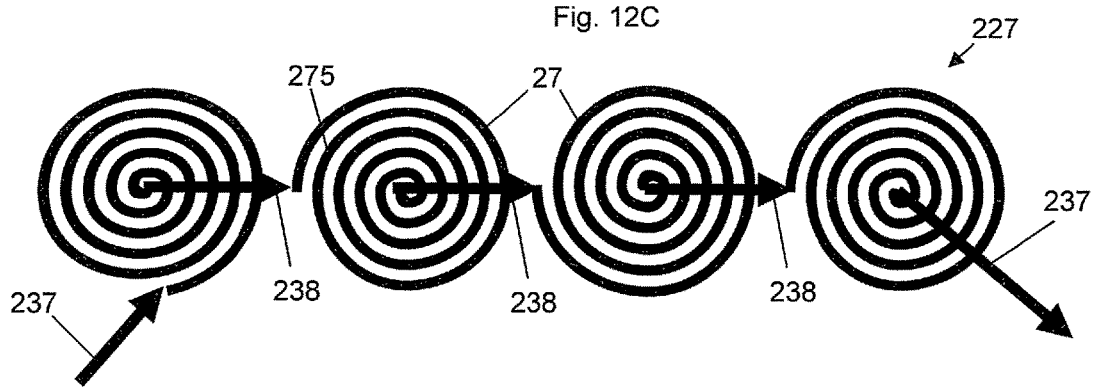

As mentioned above, in some exemplary embodiments, power transmission line segment 227 may include four coils 27, as shown in FIGS. 12A, 12B and 12D. The length of such power transmission line segment 227 may be of about 100-130 cm. The interface points between coils 27 enhance the mutual inductance of adjacent coils 27, and, therefore, the general inductance of power transmission line segment 227 and/or of subsequent power transmission line segments 227. FIG. 12B shows three subsequent power transmission line segments 227.

FIGS. 12C and 12D show the manner of coiling of wires 275 of coils 27 in series-connected subsequent coils 27 in power transmission line segments 227a and 227, respectively, and the manner of connection between series-connected subsequent coils 27 by conductors 238. Transitions between subsequent or preceding power transmission line segments 227a or 227 are shown by arrows 237 that depict connections with subsequent or preceding power transmission line segments 227a or 227. The transitions between subsequent or preceding power transmission line segments 227a or 227 are characterized by a large potential difference, which requires enhanced electrical isolation. This manner of coiling and connection may be similar for coils 17 of receiver arrays 117 and 117a shown in FIGS. 13A and 13B.

Figure 13A:
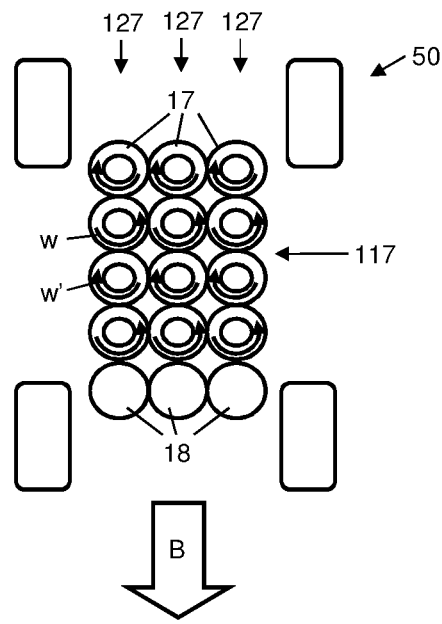
FIGS. 13A and 13B are schematic illustrations of receiver arrays on the underneath of a vehicle according to some embodiments of the present invention.
Figure 13B:
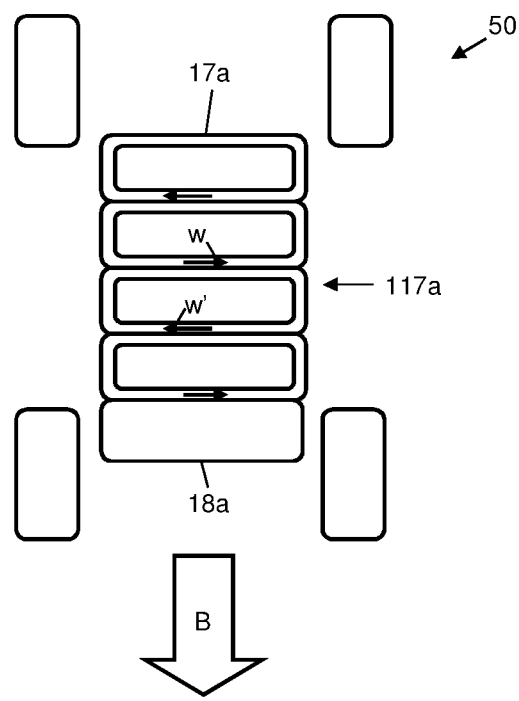

Reference is now made to FIGS. 13A and 13B, which are schematic illustrations of receiver arrays 117 and 117a on the underneath of a vehicle 50, respectively, according to some embodiments of the present invention. Receiver arrays 117 may include a number of rows 127, each constitutes an array of receiver coils 17. A row 127 may include any suitable number of receiver coils 17, for example according to the length of vehicle 50 and/or any other suitable considerations. Additionally, a row 127 may include a communications coil 18 that may be located at the front of the receiver coils 17 in the driving direction B of the vehicle. Receiver array 117 may include any suitable number of rows 127, for example according to the width of vehicle 50 and/or any other suitable considerations. In accordance with the power transmission line segments 227 or 227a, receiver array 117 may be suitable for a one-phase configuration of embodiments of the present invention. Accordingly, two adjacent receiver coils 17 in row 127 may have opposite current direction, for example as shown by arrows w and w', and/or coils 17 of an array 117 may be connected in series, for example, similarly to the coiling and connection of accumulator coils 27 of power transmission line segment 227 or 227a shown in FIGS. 13C and 13D.

Alternatively, a receiver array 117a may include a series of oval or rectangular series-connected oblong receiver coils 17a, wherein two adjacent receiver coils 17a may have opposite current direction, for example as shown by arrows w and w'. The width of oblong receiver coils 17a may be determined according to the width of vehicle 50 and/or any other suitable considerations. Receiver array 117a may also include, for example, an oblong communications coil 18a that may be located at the front of the receiver coils 17a in the driving direction B of the vehicle.

Figure 14:
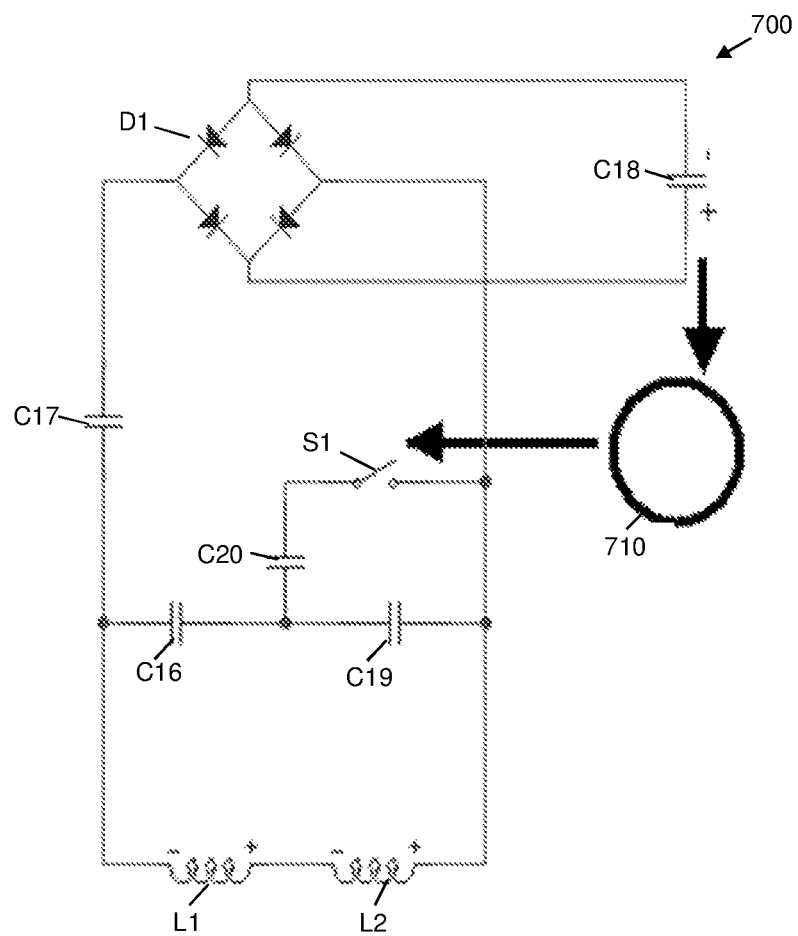
FIG. 14 is a schematic illustration of a receiver circuit for energy gathering from a receiver array according to some embodiments of the present invention.

Reference is now made to FIG. 14, which is a schematic illustration of a receiver circuit 700 for energy gathering from receiver array 117 or 117a according to some embodiments of the present invention. Circuit 700 may include, for example, two coils L1 and L2 connected in series, although any other suitable number of coils may be included. Coils L1 and L2 may represent the inductances of two subsequent coils 17 (or 17a) in array 117 (or 117a), having inductances L1 and L2, respectively. Coils L1 and L2 may be connected in parallel to capacitors C16, C19 and C17, as shown in circuit 700, wherein capacitors C16 and C19 are connected in series and have together an equivalent capacitance C1. The energy, i.e. the outlet voltage, may be collected by capacitor C18 via diode bridge D1. The resonance frequency of circuit 700 in this case may be approximately inversely proportional to the square root of (L1+L2)·(C17+C1).

Circuit 700 may further include a mechanism for regulating the resonance frequency of receiver circuit 700 according to the load requirements, for example the requirements of engine/inverter 72 of vehicle 50. According to some embodiments of the present invention, the energy received via receiver coils 17 is provided directly to power engine/inverter 72 and not to charge a battery or another power storage device, except for a small portion of the energy stored for a back-up, for example in accumulator 70. Usually, the resonance frequency of receiver circuit 700 is higher than the resonance frequency of power transmission line segment 227 (or 227a), and, therefore, the energy transfer between receiver array 117 or 117a and power transmission line segment 227 (or 227a) may not be optimal. Therefore, circuit 700 may include a pulse-width modulator (PWM) controller 710, a switch S1 and an additional capacitor C20, which may be connected in parallel to capacitor C19 when switch S1 is closed. PWM controller 710 may sense when the load needs more power and when the load needs less power. When switch S1 is open and PWN controller 710 senses that the load needs more power, it may close switch S1. Since closing switch S1 adds capacitor 20 in parallel to capacitor C19, the resonance frequency of receiver circuit 700 may be reduced to the resonance frequency of power transmission line segment 227 (or 227a), which may improve the energy transfer and increase the outlet voltage at capacitor C18. When switch S1 is closed and PWN controller 710 senses that the load needs less power, it may open switch S1 and thus, for example, capacitor C20 will be disconnected. When capacitor C20 is disconnected, the resonance frequency of receiver circuit 700 may be increased above the resonance frequency of power transmission line segment 227 (or 227a), which may reduce the outlet voltage at capacitor C18. The regulation by PWM controller 710 may be performed dynamically and in a sufficient speed to provide sufficient stability of power supply. Switch S1 should be stable enough to bear the high voltage differences.

Reference is now made to FIGS. 15A-15F, which are schematic illustrations of the mechanical installation and structure of power transmission line 20, according to some embodiments of the present invention. Power transmission line 20 may be mechanically and electrically protected, and sealed against humidity and/or dampness. Power transmission line 20 may be constructed from power transmission line basic installation units 250 as described in detail herein.

Figure 15A:
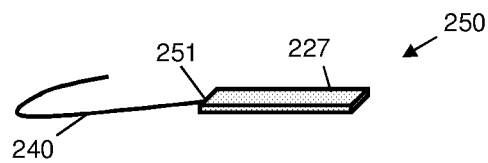
FIGS. 15A-15F are schematic illustrations of the mechanical installation and structure of an power transmission line according to some embodiments of the present invention.
Figure 15B:
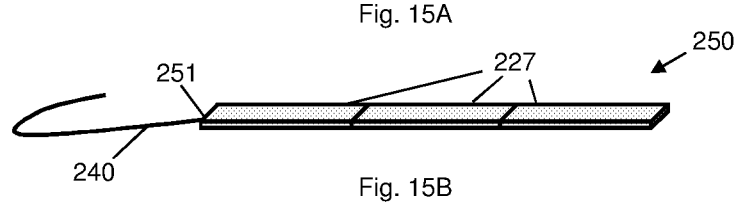

FIGS. 15A and 15B are schematic illustrations of power transmission line basic installation units 250, according to some embodiments of the present invention. Basic installation unit 250 may be a monolithic unit and/or may include an power transmission line segment 227 (or 227a), as shown in FIG. 15A, or several power transmission line segments 227 (or 227a), as shown in FIG. 15B, and conductors 240 coming out of one end 251 of unit 250, to conduct current to segments 227 (or 227a) and/or from segments 227 (or 227a). Basic installation unit 250 may be include several power transmission line segments 227 (or 227a), as shown in FIG. 15B, for example three power transmission line segments 227 (or 227a) or any other suitable number of power transmission line segments 227 (or 227a). Basic installation units 250 may be placed sequentially in a row within canal 32 in road 30.

Figure 15C:
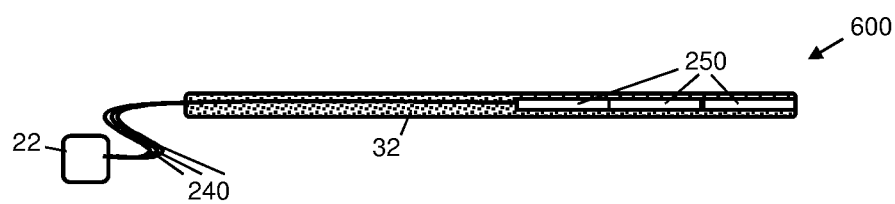
Figure 15D:
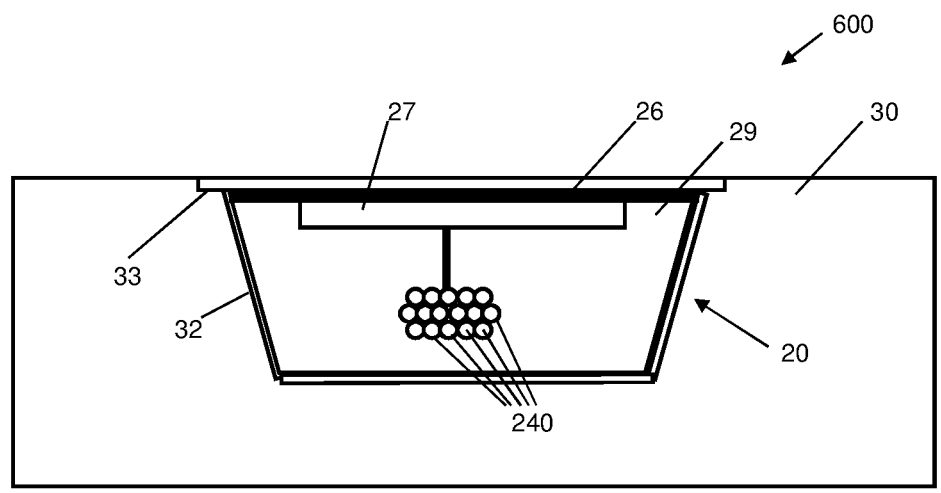

FIGS. 15C and 15D are schematic illustrations of an above view and a frontal cross-sectional view, respectively, of the structure and installation 600 of power transmission line 20 according to some embodiments of the present invention. Installation 600 may include canal 32, which may be ditched in road 30. Basic installation units 250 may be placed sequentially within canal 32. For example, the first installation unit 250 may be put in the distal end of the canal relative to generator 22 described in detail herein, e.g., in the end of canal 32 far from generator 22. Conductor 240 coming out of one end of unit 250 may be placed in canal 32 in the direction of generator 22. For example, the end 251 of unit 250 from which conductor 240 comes out, is placed in the direction of generator 22. For example, the distal end of conductor 240 relative to unit 250 may reach generator 22. Each subsequent unit 250 may be placed on conductor(s) 240 of the previous unit(s), adjacent to the previous unit 250 and in the same orientation, i.e., so that the end of unit 250 from which conductor 240 comes out, is placed in the direction of generator 22, and/or so that conductor 240 coming out of one end of unit 250 may be placed in canal 32 in the direction of generator 22. In this manner, units 250 may be placed one after the other, from the distal unit 250 relative to generator 22 to the proximal unit 250 relative to generator 22. The distal ends of conductors 240, relative to units 250, may reach generator 22.

As shown in FIG. 15D, within canal 32, installation 600 may include insulator casting 29 to insulate power transmission line segment 227 (or 227a), for example from all sides except the top of coils 27, for example, in order to enable power transmission line 20 to transfer power via the top of coils 27 exclusively. Installation 600 may further include, for example, an adhesive layer 26, to attach a layer 33 of stones or asphalt upon power transmission line 20. Conductors 240 coming out of units 250 may be placed one adjacent to the other, electrically isolated one from another, and in an ordered cluster in order to prevent loops and/or intertwining of the conductors wires.

Figure 15E:
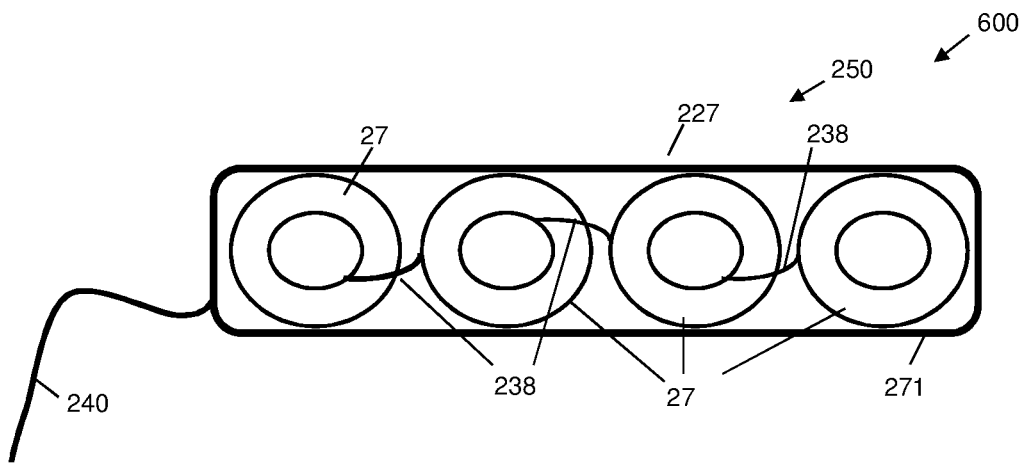
Figure 15F:
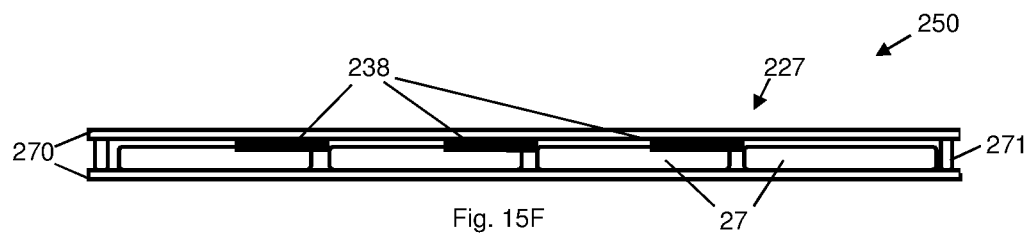

FIGS. 15E and 15F are schematic illustrations of a detailed above view and a longitudinal cross-sectional view, respectively, of the structure and installation 600 of basic installation units 250, including power transmission line segment 227 and a conductor 240, according to some embodiments of the present invention. Power transmission line segment 227 may be placed, for example, between two surfaces 270 of polycarbonate or any other suitable insulating and/or waterproof material, which do not reduce the inductance significantly. Additionally, power transmission line segment 227 may be surrounded in its periphery by a seal 271, which may seal power transmission line segment 227 against humidity and voltage outbreaks. The distances 1 between coils 27 may be determined by taking into account the electric potential, in order to prevent voltage outbreaks. Subsequent coils 27 within segment 227 may be connected to each other by conductors 238, for example in the manner shown in FIG. 8D.

Figure 16A:
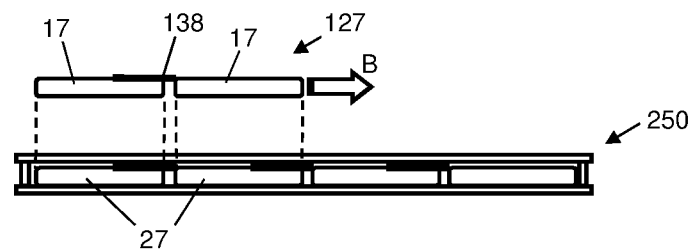
FIGS. 16A-16D illustrate schematically the dependency of the energy transmittance between accumulator coils and receiver coils on the location of a receiver array row above an power transmission line segment according to some embodiments of the present invention.
Figure 16B:
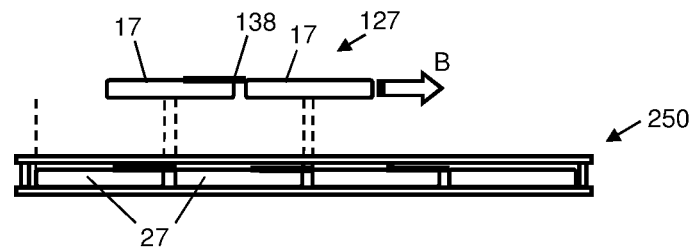
Figure 16C:
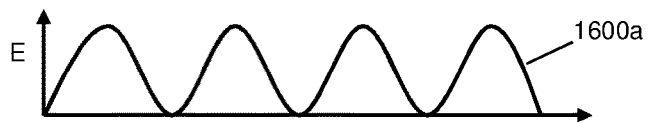
Figure 16D:
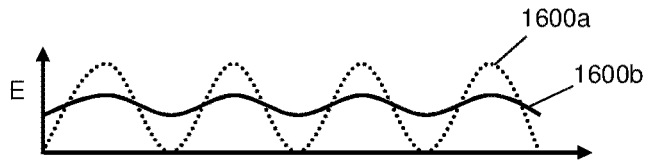

Reference is now made to FIGS. 16A-16D, which illustrate schematically the dependency of the energy transmittance between accumulator coils 27 and receiver coils 17 on the location of receiver array row 127 above power transmission line segment 227, according to some embodiments of the present invention. FIGS. 16A and 16B are schematic illustrations of receiver array row 127 and power transmission line segment 227 according to some embodiments of the present invention. For example, a receiver array row 127 may include two receiver coils 17 and a conductor 138, connecting the two coils 17 in series. When vehicle 50, with receiver array 117 in its bottom, passes above power transmission line segment 227 in the driving direction B, sometimes receiver coils 17 may be aligned above corresponding accumulator coils 27, for example as shown in FIG. 16A, so that the energy transmittance may be maximal, and sometimes receiver coils 17 may be located above the transition areas between two subsequent accumulator coils 27, for example as shown in FIG. 16B, where the energy transmittance may be reduced. FIG. 6C is a schematic graph illustration 1600a of the energy transmittance versus the location of receiver array row 127 above power transmission line segment 227. As shown in graph illustration 1600a, the energy transmittance may be uneven along power transmission line segment 227. FIG. 6D shows a schematic graph illustration 1600b of the energy transmittance versus the location of receiver array row 127 above power transmission line segment 227, mediated by a capacitor. As shown by graph illustration 1600b capacitor connected to receiver array row 127 may reduce the energy transmittance differences along power transmission line segment 227 shown in graph illustration 1600a.

As discussed herein, some embodiments of the present invention may provide solutions to prevent radiance leakage from power transmission line 20. As mentioned above, by having adjacent coils with opposite current directions and thus, for example, opposite magnetic fields, the magnetic field fades outside the area of power transmission line 20 and becomes stronger within the area of power transmission line 20. This solution is suitable, for example, for embodiments of the present invention that use single-phased power.

Figure 17:
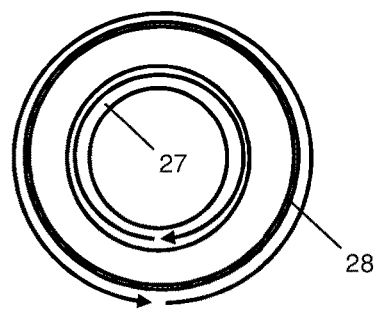
FIG. 17 is a schematic illustration of an additional solution to prevent radiance leakage from an power transmission line according to some embodiments of the present invention.

Reference is now made to FIG. 17, which is a schematic illustration of an additional solution to prevent radiance leakage from power transmission line 20, according to some embodiments of the present invention. Power transmission line 20 may have opposite coil windings 28 around accumulator coil 27, with an opposite current direction to the current direction in coil 27. The opposite current direction in opposite coil windings 28 reduces the magnetic field around coil 27.

Figure 18:
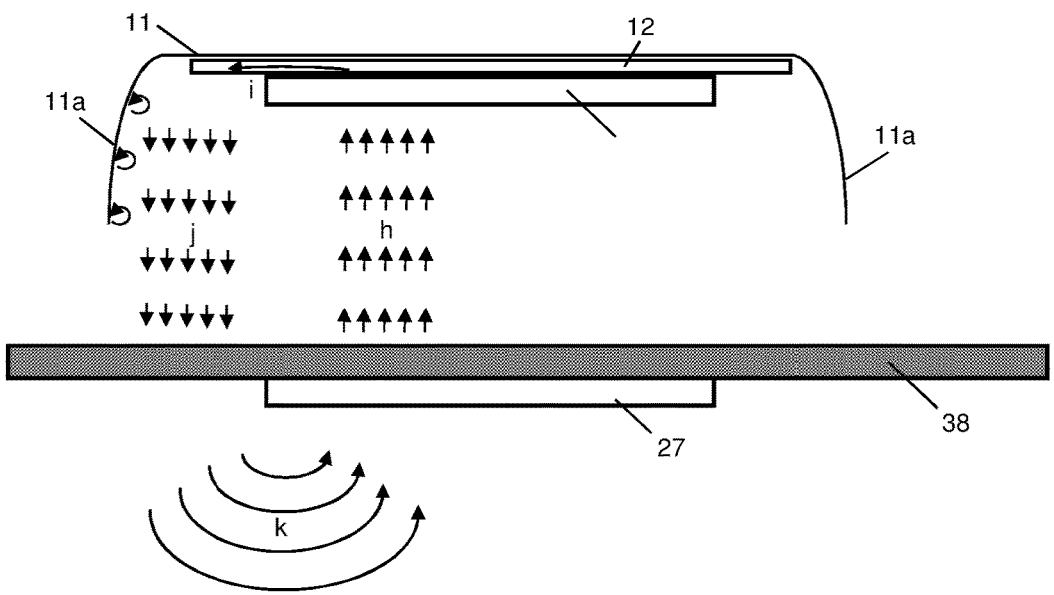
FIG. 18 is a schematic illustration of an additional solution to prevent radiance leakage from an power transmission line and a receiver array according to some embodiments of the present invention.

Reference is now made to FIG. 18, which is a schematic illustration of an additional solution to prevent radiance leakage from power transmission line 20 and receiver array 10 or 117 (or 117a), according to some embodiments of the present invention. In some embodiments of the present invention, protecting materials may be used in order to channel and/or screen the magnetic fields. For example, receiver array 10 or 117 (or 117a) may include an aluminum foil 11 between insulator plate and the bottom of vehicle 50, wherein aluminum foil 11 includes reminders 11a that are folded down to the sides of receiver coil 17. The magnetic flow created by accumulator coil 27 under layer 33 of stones or asphalt go up as shown by arrows h through receiver coil 17 and induce current. Than the magnetic flow meets insulator plate 12, turns, as shown by arrow I, and proceeds down, as shown by arrows j, to close the magnetic field loop as shown by arrows k. However, a portion of the magnetic flow penetrates through the insulator plate 12 and turns to heat and thus, for example, creating vortex flows, shown by arrows p, in aluminum foil reminder 11a. As the aluminum foils reminders 11a are longer, i.e., get lower, the magnetic flow leakage may be smaller.

Figure 19A:
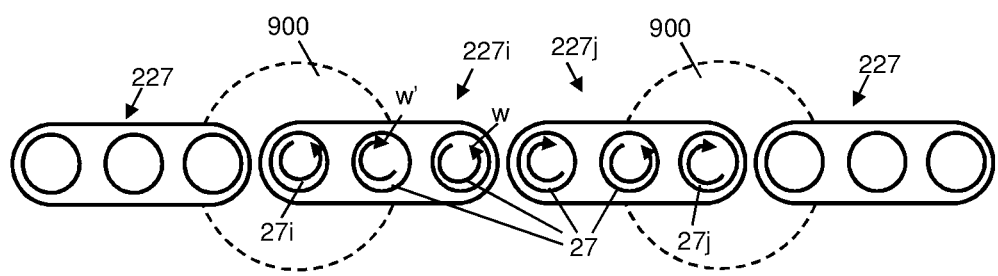
FIGS. 19A and 19B are schematic illustrations of power transmission line segments in a section of an power transmission line according to some embodiments of the present invention.
Figure 19B:
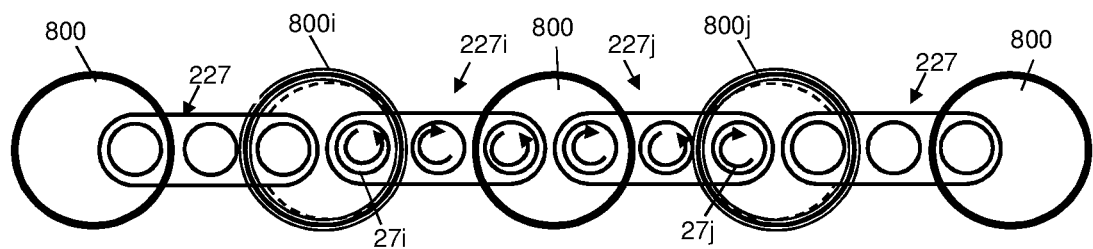

Reference is now made to FIGS. 19A and 19B, which are schematic illustrations of power transmission line segments 227 in a section of power transmission line 20, according to some embodiments of the present invention. In FIGS. 19A and 19B, each power transmission line segments 227 may include three accumulator coils 27, although the invention is no limited in that respect. Subsequent power transmission line segments 227i and 227j are electrified, i.e., receive power from generator 22. Each two subsequent accumulator coils 27 have an opposite current direction, as shown by arrows w and w'. Current direction w is opposite to current direction w'. Therefore, the magnetic fields of two subsequent accumulator coils 27 fade each other outside the area of the coils, except the magnetic fields of the extreme coils 27i and 27j which are located in the extremes of the electrified section of power transmission line 20, which includes subsequent power transmission line segments 227i and 227j. The magnetic fields of extreme coils 27i and 27j do not fade, and thus constitute sources of residual radiation 900.

According to some embodiments of the present invention, power transmission line 20 may include guard rings 800, wherein each guard ring 800 surrounds the two adjacent extreme coils 27 of two subsequent power transmission line segments 227, as shown in FIG. 19B. Guard ring 800 constitutes of a closed electrical-conductive ring. Ring 800 shorts the magnetic field that passes through ring 800. When no magnetic field passes through ring 800, or when the magnetic fields fade each other as in ring 800 between the electrified power transmission line segments 227i and 227j, ring 800 is indifferent and/or has no significant influence on the operation of power transmission line 20. Since the magnetic field created by extreme coils 27i and 27j are not faded, respective rings 800i and 800j are active and capture the fields and reduce the residual radiation. Other rings 800 have no significant magnetic field through them and thus, for example, remain indifferent. Rings 800i and 800j slightly reduces the power provided by extreme coils 27i and 27j, but solve the residual radiation problem Similar rings may be installed, in similar manner, in receiver array 10 or 117 (or 117a).

In the remainder of this application, several specific non-limiting exemplary embodiments of the present invention are illustrated herein.

Figure 20:
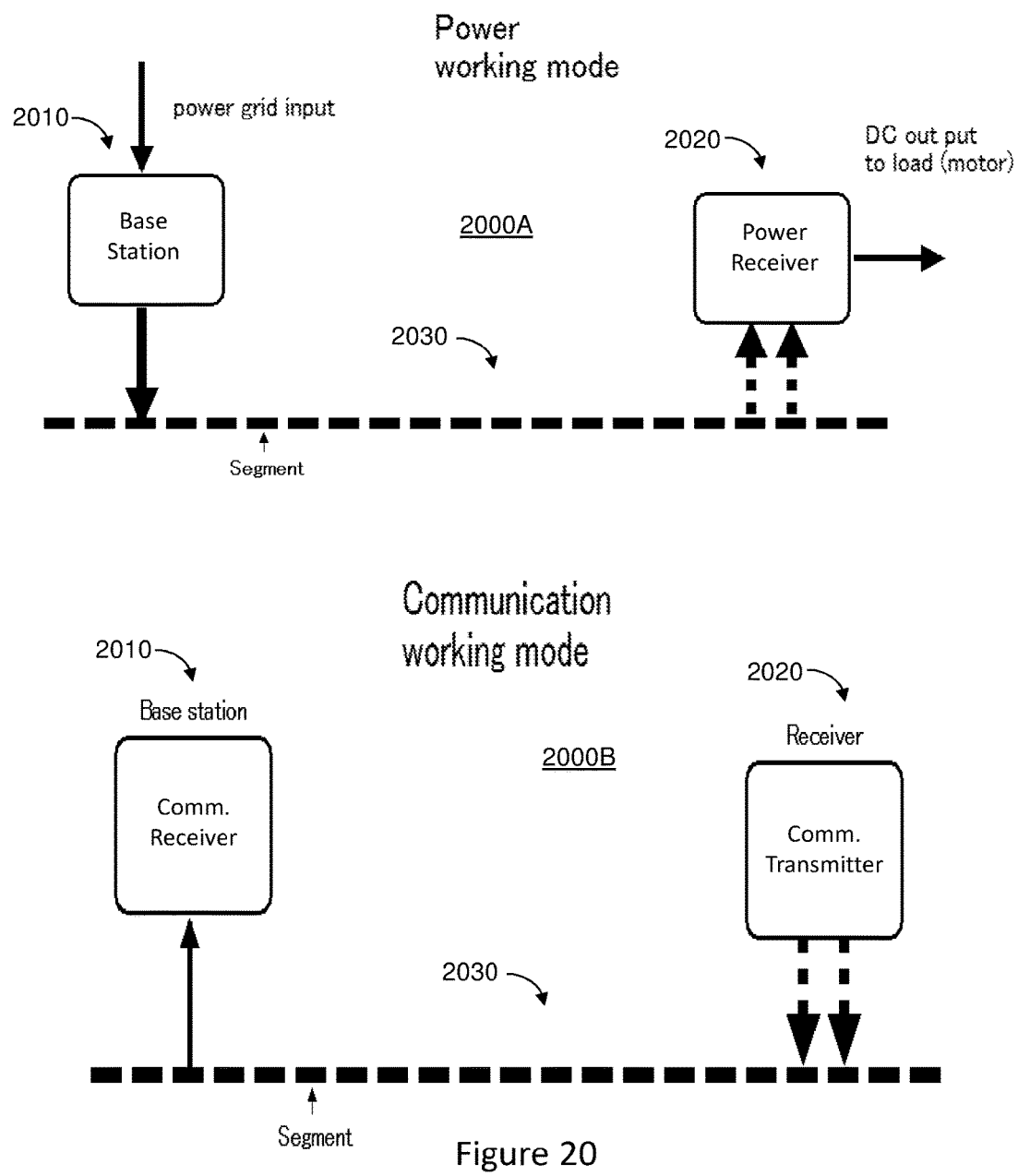
FIG. 20 is a schematic block diagram illustrating a system according to some embodiments of the present invention.

FIG. 20 is a schematic block diagram illustrating the two working mode nature of the system according to some embodiments of the present invention. Configuration 2000A illustrates a power working mode where power grid input is provided into base station 2010 (the power transmitter, on the road side) which in turn conveys the energy to the operative segments along the power line 2030. Power receiver 2020 (on vehicle side) receives the electromagnetic flux which is then converted to a direct current (DC) and provided to the load (motor). In a communication working mode 2000B, same base station 2010 now acts a communication receiver, while power receiver 2020 now acts as communication transmitter which transmits a request for power into power line 2030 in a manner that same segments the are used on the power line (rode side) to carry out the power transmission are the same segments that are used to receive communication signals form the vehicle side. Advantageously, the dual use of the segments on the road side enable a more efficient infrastructure.

Figure 21:
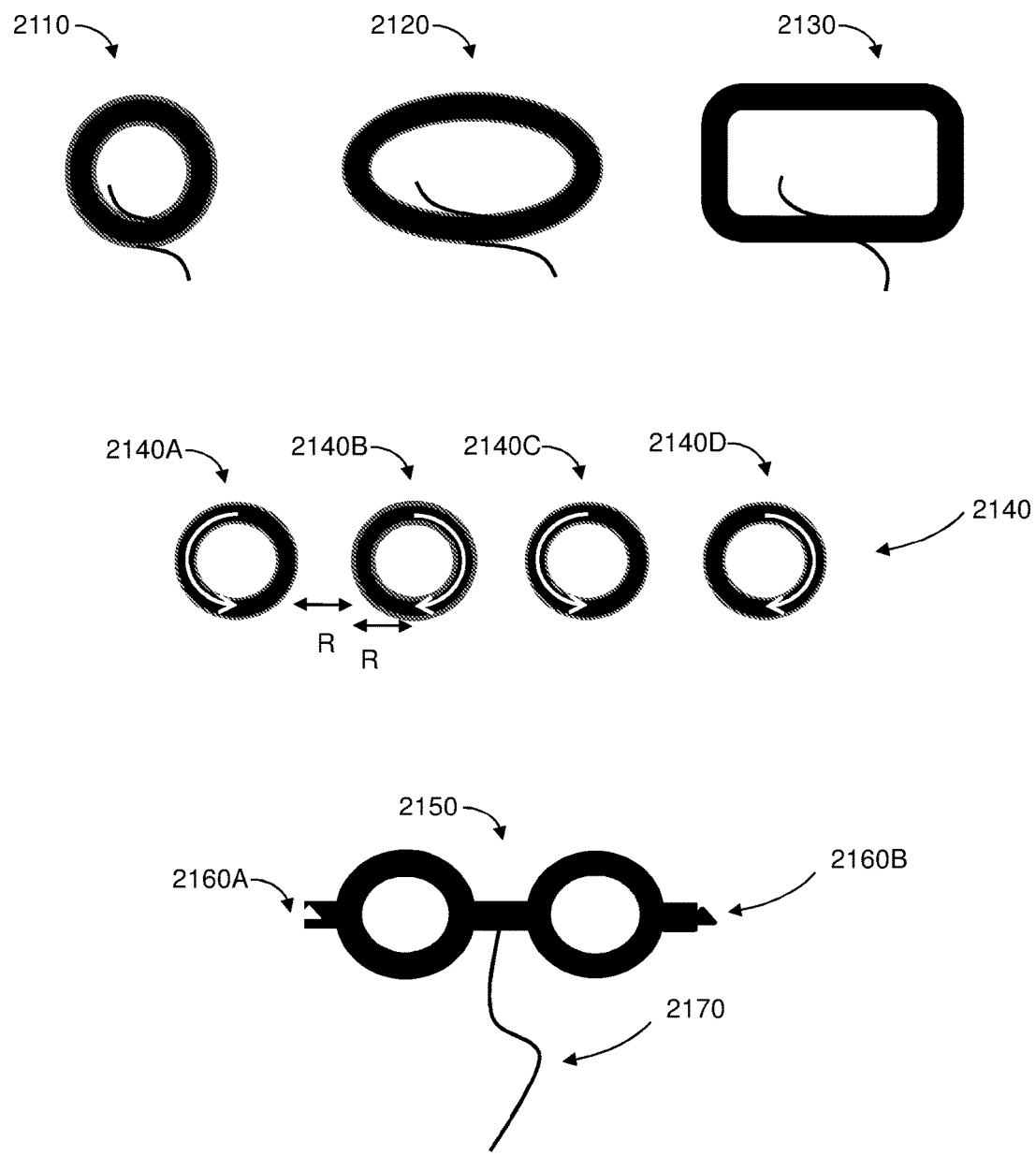
FIG. 21 is a diagram illustrating some aspects relating to the coils according to some embodiments of the present invention.

FIG. 21 is a diagram illustrating some aspects relating to the coils according to some embodiments of the present invention. As discussed above, each segment includes two or more pairs of opposite-phase coils. Each coil can be of various shapes. The inventors have discovered that apart from the circular spiral coil 2110, both ellipsoid spiral coil 2120 and square spiral coil 2130 can be used efficiently. Coils in same segment 2140 are connected in series, where each adjacent coils (e.g., 2140A and 2140B) have opposite phase. In a case of circular coils, it is preferred to have two adjacent coils positioned at a radius R (of the coil) apart from each other. From a mechanical aspect, a spectacle-like shape 2150 may be used for each pair of the coils which may be fed by a single wire 2170. In some embodiments, a bee-sting like connectors 2160A and 2160B are on both sides of the segment for enable efficient concatenation of segments and for preventing misalignment of segments.

Figure 22:
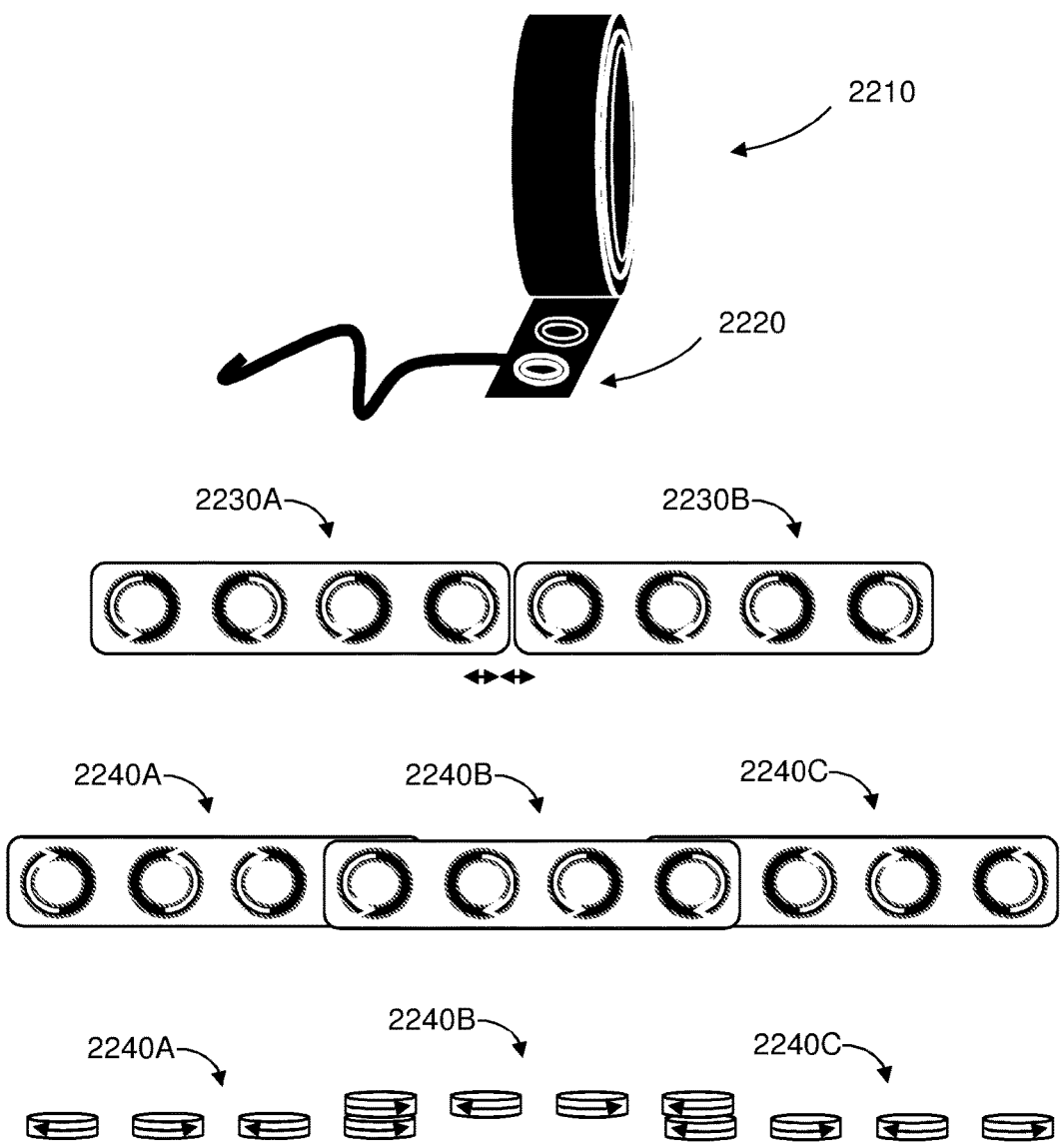
FIG. 22 is a diagram illustrating other aspects relating to the coils according to some embodiments of the present invention.

FIG. 22 is a diagram illustrating other aspects relating to the coils according to some embodiments of the present invention. To facilitate deployment of the power line of segments, a roll 2210 of the segments 2220 may be used.

Using a flexible material is one way to ensure easy deployment of the powerline before asphalt is applied. In one configuration, non-overlapping segment 2230A and 2230B can be used. In another embodiment, overlapping segment 2240A, 2240B and 2240C can be used. In overlapping segments, two adjacent coils are overlapping. The electromagnetic flux of overlapping coils are added in overlapping coils which assists in low k coupling coefficient level and when the receiver is closer to the edges of the segment.

Figure 23:
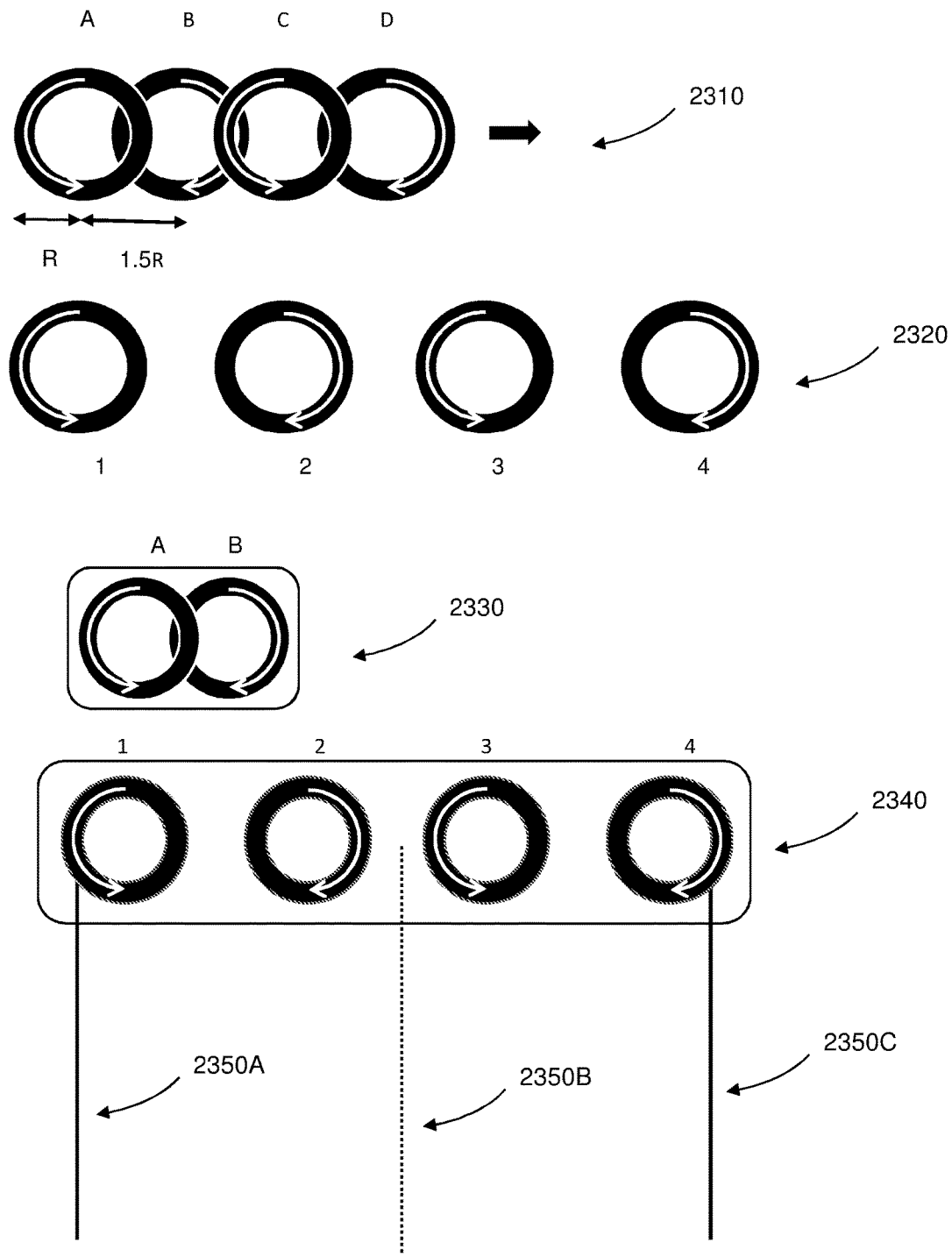
FIG. 23 is a diagram illustrating yet other aspects relating to the coils according to some embodiments of the present invention.

FIG. 23 is a diagram illustrating yet other aspects relating to the coils according to some embodiments of the present invention. A segment 2310 on the power receiver (vehicle side) is shown in which the coils are identical to those on the power transmitter (road side). A minimal number of two coils at the power receiving segment is contemplated. In one non-limiting embodiment, 4 power receiver coils A, B, C, and D may be 1.5 R (R being radius of coils) apart where coils A, B, C, and D act as standalone inductor circuits which receive power independently of the each other.

Alternatively, coil A and coil C may be connected in parallel and coils B and coil D are also connected in parallel. Coils on power transmitter segment 2320 may be so arranged that power receiver coils A and C overlap power transmitter coils 1 and 2 respectively and upon movement of power receiver (vehicle) to the right, power receiver coils B and D become overlapping with power transmitter coils 2 and 4.

On the communication mode, communication transmitter segment 2330 (vehicle side) has coils A and B (preferably different from power receiver coils A and B of 2310) that may not be transmitting simultaneously but rather in a mutually exclusive manner (while A transmits, B does not and vice versa). Communication receiver segment 2340 (road side) uses the exact coils 1-4 of coils 1-4 of power transmitter segment 2320 but additionally, a communication wire 2530B is added to power wires 2350A and 2350B. In operation, the alternating operation (transmission) of communication signal over A and B of 2330 guarantees a continuous current at communication wire 2350B which is interpreted at the base station as a request for power from the vehicle at a specified segment.

Figure 24:
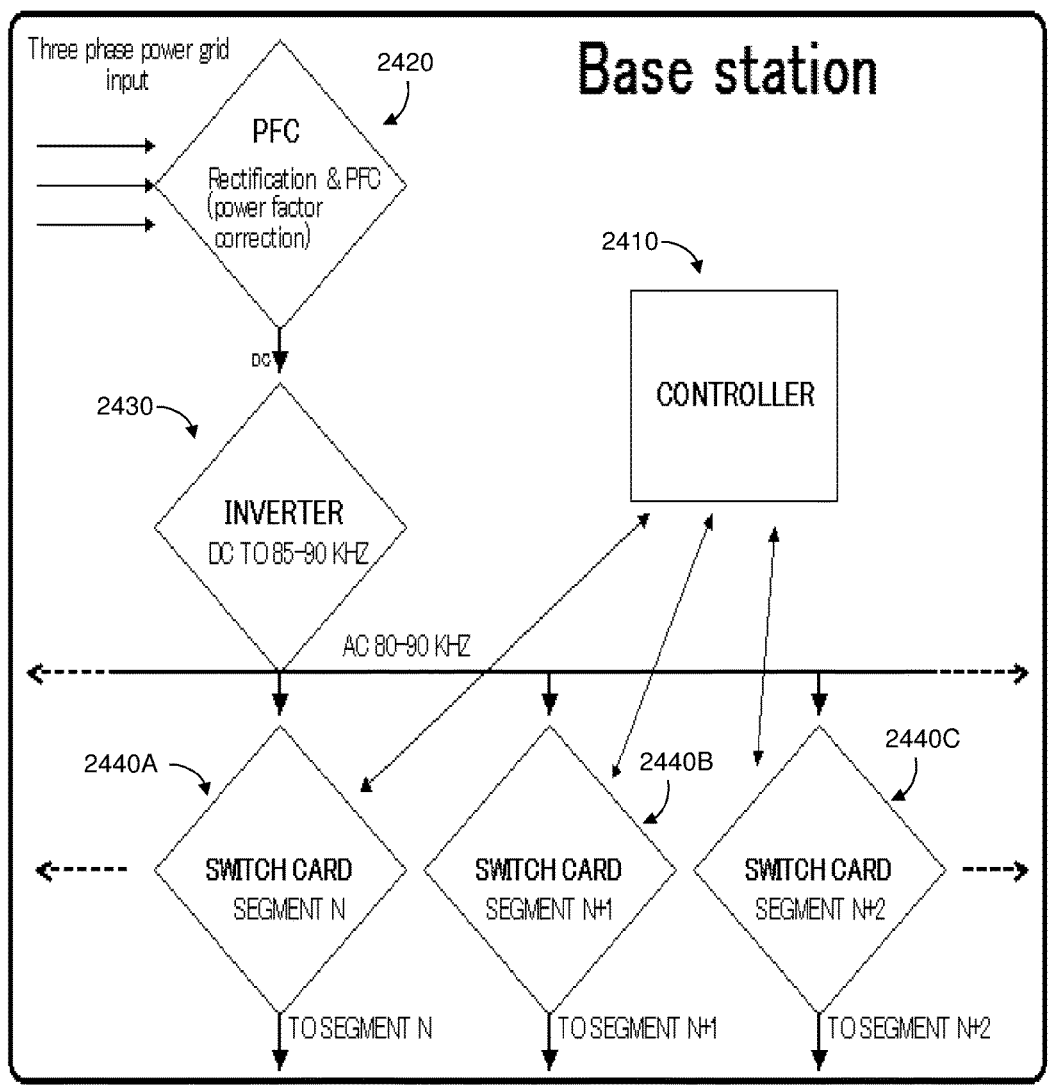
FIG. 24 is a diagram illustrating aspects relating to the base station according to some embodiments of the present invention.

FIG. 24 is a diagram illustrating aspects relating to the base station according to some embodiments of the present invention. The base station controls a plurality of segments independently of each other. An input of a three phase power grid is fed into rectification a power factor correction (PFC) module 2420 which feeds direct current (DC) a inverter 2430 which in turn generates an alternating current (AC) at a frequency of approximately 85-90 KHz (being the preferred resonance frequency of the inductance circuits at the power transmitting and power receiving segments) which is feeding the segments via respective switch cards 2440A, 2440B, and 2440C, each switch card is associated with a different segment and controlled by a central controller 2410. In operation, whenever each switch card (e.g., 2440A) senses a request for power from its respective segment (e.g., segment N, not shown), switch card (e.g., 2440A) notifies controller 2410 which in turn (after verifying identity and other network level considerations) instructs switch card (e.g., 2440A) to allow the 85-90 KHz power signal to reach the corresponding segment (e.g., segment N).

Figure 25:
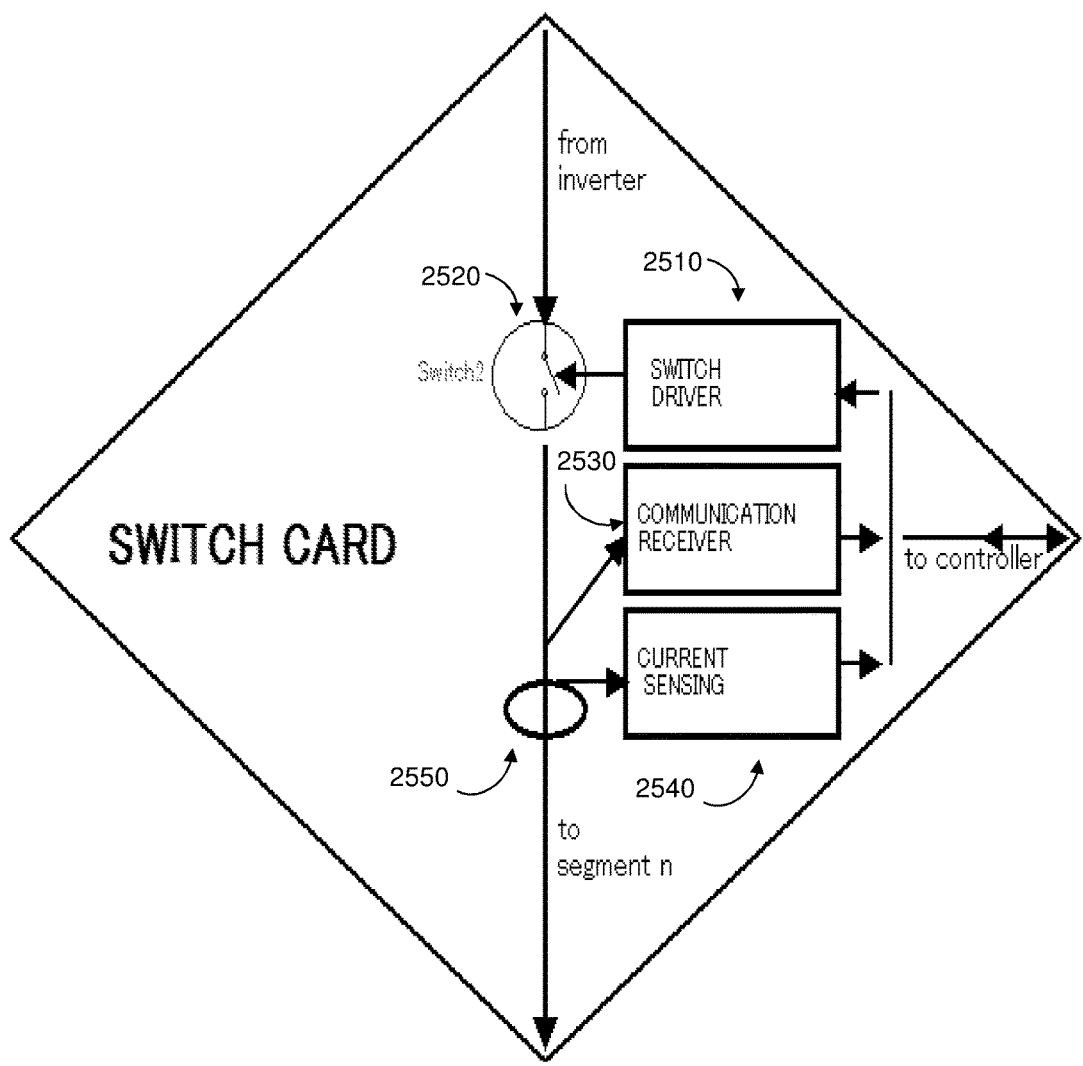
FIG. 25 is a diagram illustrating other aspects relating to the switch card according to some embodiments of the present invention.

FIG. 25 is a block diagram illustrating a non-limiting implementation of the switch card according to some embodiments of the present invention. The switch card may include a current loop 2550 encompassing or encircling the wire coming from the communication receiver coils on the road side. When current is sensed by current sensor 2540, communication receiver interacts with the controller which determines whether, given other parameters such as network availability and identification of the vehicle, to connect or disconnect switch 2520 via switch driver 2510.

Figure 26:
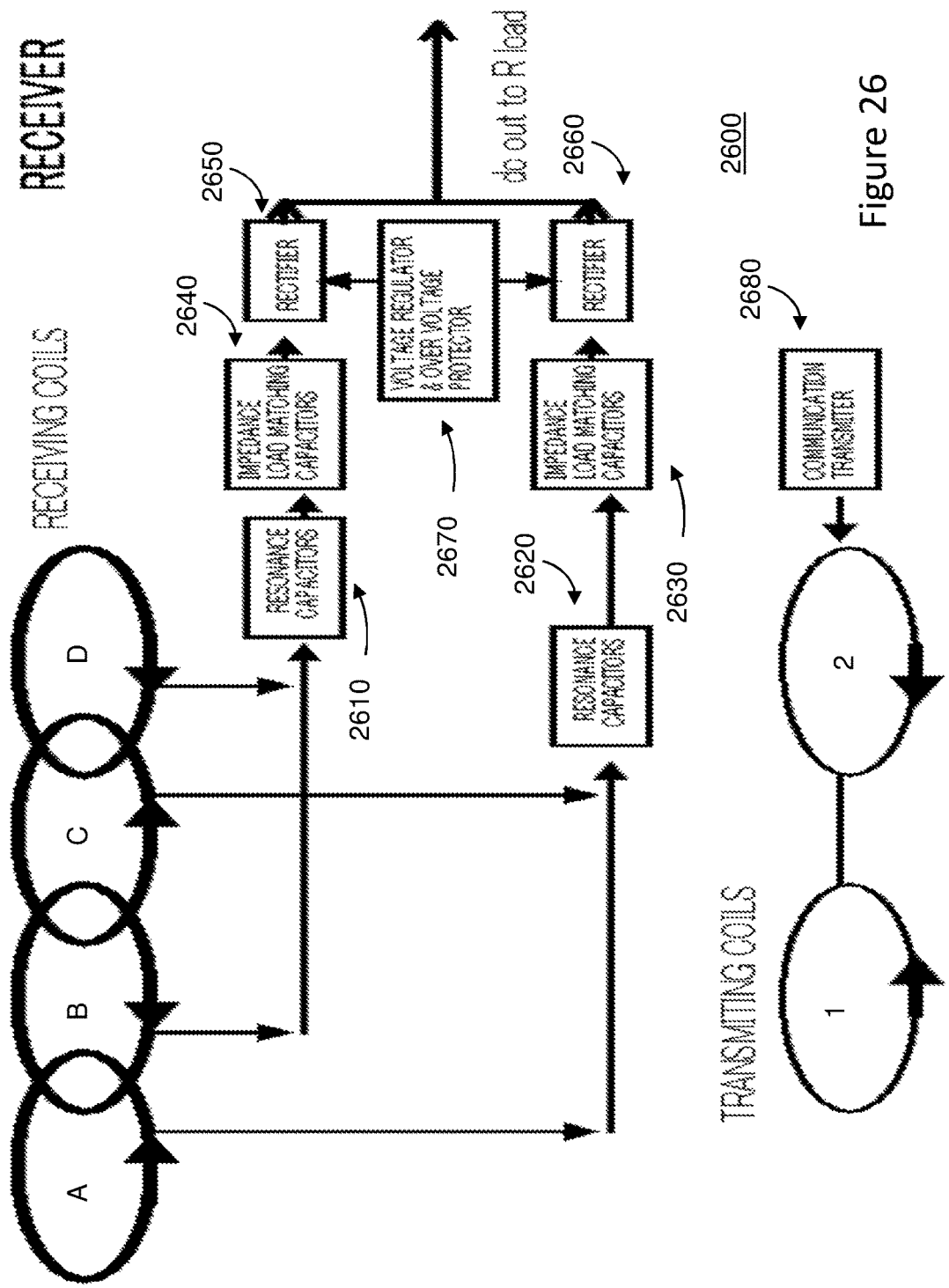
FIG. 26 is a diagram illustrating other aspects relating to the receiver according to some embodiments of the present invention.

FIG. 26 is a diagram illustrating aspects relating powering aspect on the receiver side according to some embodiments of the present invention. Power transmitting coils 1 and 2 are instructed by communication module on the road side 2680 to provide energy to respective power receiving coils A, B, C, and D (resonance with 1 and 2 only occur two at a time, A and C, and B and D). Each pair of coils A-C and B-D is then fed into respective resonance capacitors 2620 and 2610 respectively and then to impedance load matching capacitors 2630 and 2640, to rectifiers 2660 and 2650 and eventually to voltage regulator 2670 which outputs direct current to the load being the electric motor of the vehicle (not shown).

Figure 27:
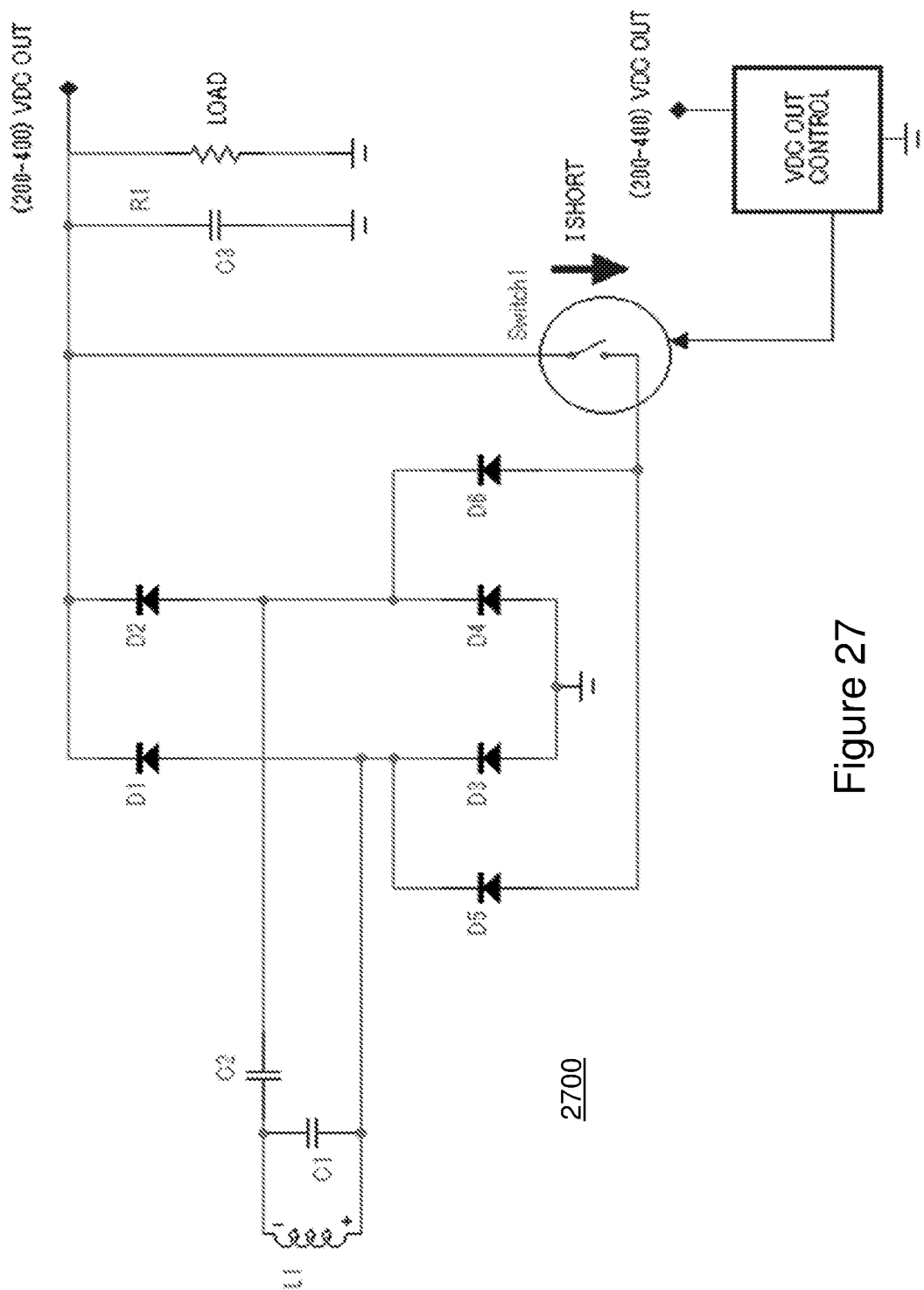
FIG. 27 is a circuit diagram illustrating other aspects relating to the receiver according to some embodiments of the present invention.

FIG. 27 is a circuit diagram illustrating other aspects relating to the mechanism of the voltage regulator at the vehicle side (receiver) according to some embodiments of the present invention. Voltage regulating circuitry 2700 includes a receiver coil L1, a resonance capacitor C1, an impedance load matching capacitor C2 for load RE Capacitors C1 and C2 with coil L1 form together a current source, and as such it may be short cut. It is referred herein as feed source. Since the feed source is a current source the output voltage is dependent upon the values of the load resistor R1 and so in a case of a very hi load or in a case of a break, the output voltage will become thousands of volts which is destructive. During regulation, switch 1 (ON position) shortcuts the feed source via diode bridge D1, D2, D5, D6. When switch 1 in in OFF position, a full rectifying of the feed source is carried out via diode bridge D1, D2, D3, D4. VDC out control circuit samples the output voltage and when the voltage reaches the predefined value it switches switch 1 to position ON, load R1 itself does not "see" a short cut and so capacitor C1 maintains its voltage and discharges only via RE When voltage value decreases to a predefined value, switch 1 shifts back to OFF and the process is repeated again and again. Regulating the output voltage will occur when switch 1 is an electronic switch such as IGBT or MOSFET that can handle the load and the required voltage. It is advantageous to operate it via an insulated push circuit because of the voltage difference between switch 1 and VDC OUT control.

Figure 28:
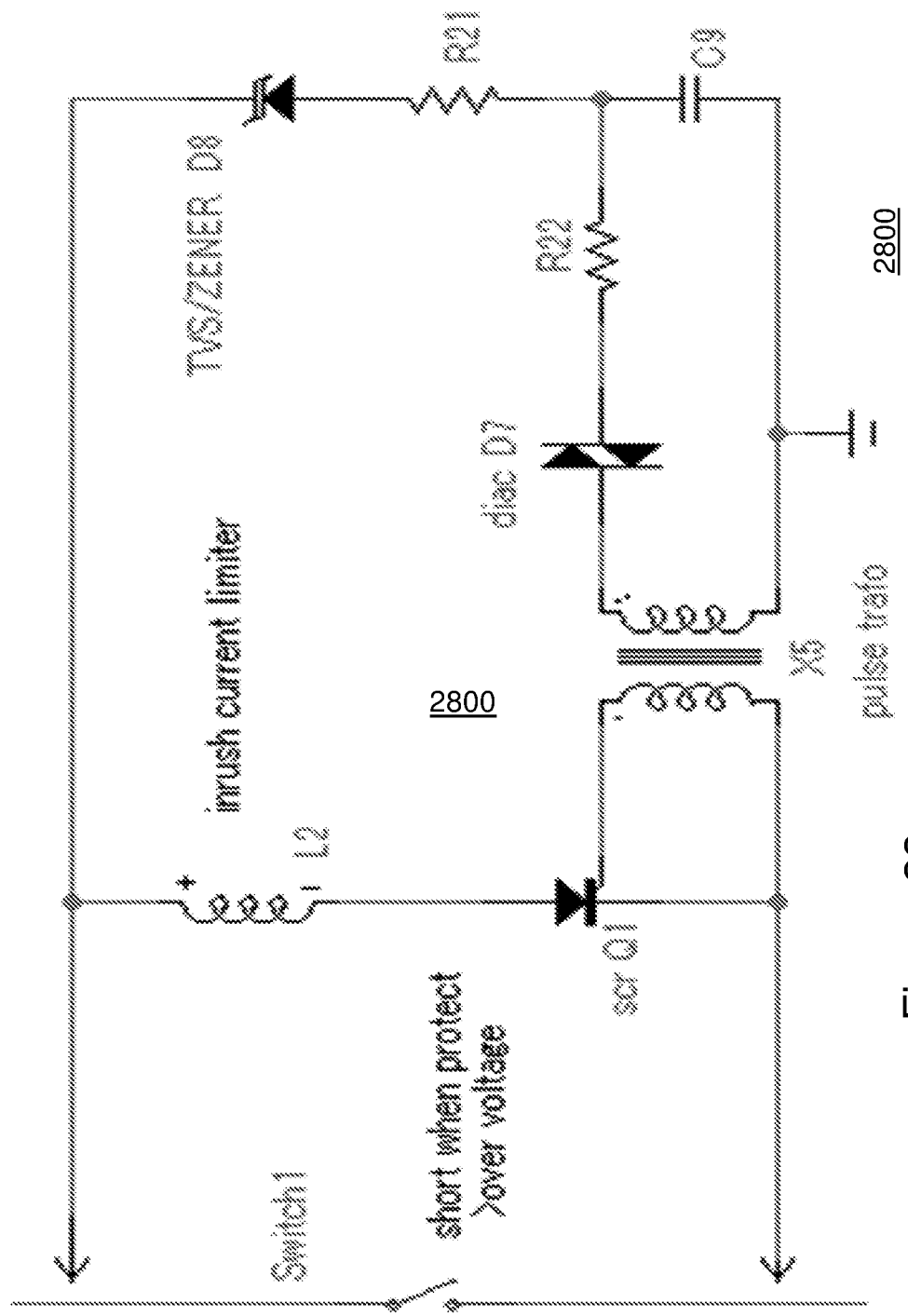
FIG. 28 is a circuit diagram illustrating other aspects relating to the receiver according to some embodiments of the present invention.

FIG. 28 is a circuit diagram illustrating other aspects relating to protecting against over voltage at the receiver (vehicle side) according to some embodiments of the present invention. This circuit connects in parallel to the circuit described in FIG. 27. Capacitor C9 is charged via resistor R21 when the output voltage reaches the voltage of Zener diode D8. When the voltage over capacitor C9 crosses the discharge point of diode D7, a pulse is generated, and it will flow via the primary windings of transformer X5 and will pass to its secondary windings. Transistor Q1 then will undergo breakdown and will shortcut switch 1. Therefore, the protection is applied when VD7+VD8 reaches an Over Voltage Protection value. This shortcut will be maintained until the currency via Q1 is halted in one of two possibilities: switch 2 in the circuit shown in FIG. 25 is OFF or an initiated shortcut over transistor Q1.

Advantageously, this circuit is independent and does not require an external voltage source. Additionally, it is very reliable because it has very few components, and all of them are passive except from transistor Q1.

Figure 29:
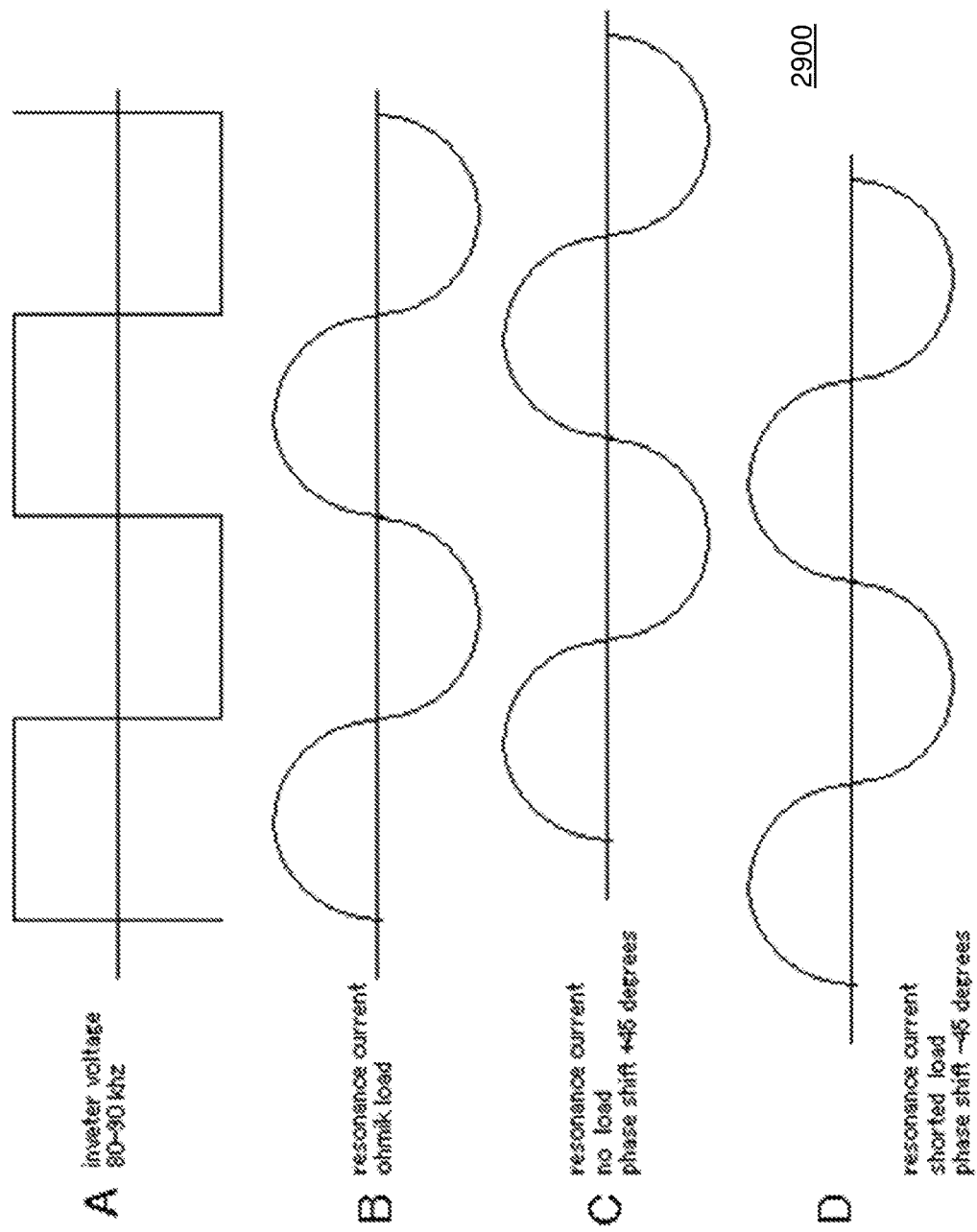
FIG. 29 are waveform diagrams illustrating aspects relating to the receiver according to some embodiments of the present invention.

FIG. 29 shows waveform diagrams 2900 illustrating aspects relating to the power receiver (vehicle side) according to some embodiments of the present invention. In accordance with some embodiments of the present invention, it is possible to regulate the voltage at the receiver by recognizing the phase of the current at the power transmitter segment. Waveform A is the inverter voltage (at the base station) while waveforms B, C, and D are the current phase at the power transmitter segment as "seen" by the load at the receiver (vehicle side). Phases B, C, and D can be easily detected by the current sensor as illustrated in FIG. 25 discussed above.

In operation and as explained above, when switch 1 such as illustrated in FIG. 27 is shortcut, current sensor such as illustrated in FIG. 25 detects a phase shift (waveform D herein) and disconnects in response the current flowing to the segment. Disconnecting the current releases transistor Q1 (as in FIG. 28) and switches to communication receiving mode. In case there is incoming communication (e.g., the receiver is located above the power transmit segments the there is demand on part of the receiver so there is a power request signal) then (and only then) switch 2 (as illustrated in FIG. 25) will shift into mode "ON", thus allowing the voltage to rise again at the receiver. This process repeats itself several time for regulating the voltage.

Figure 30:
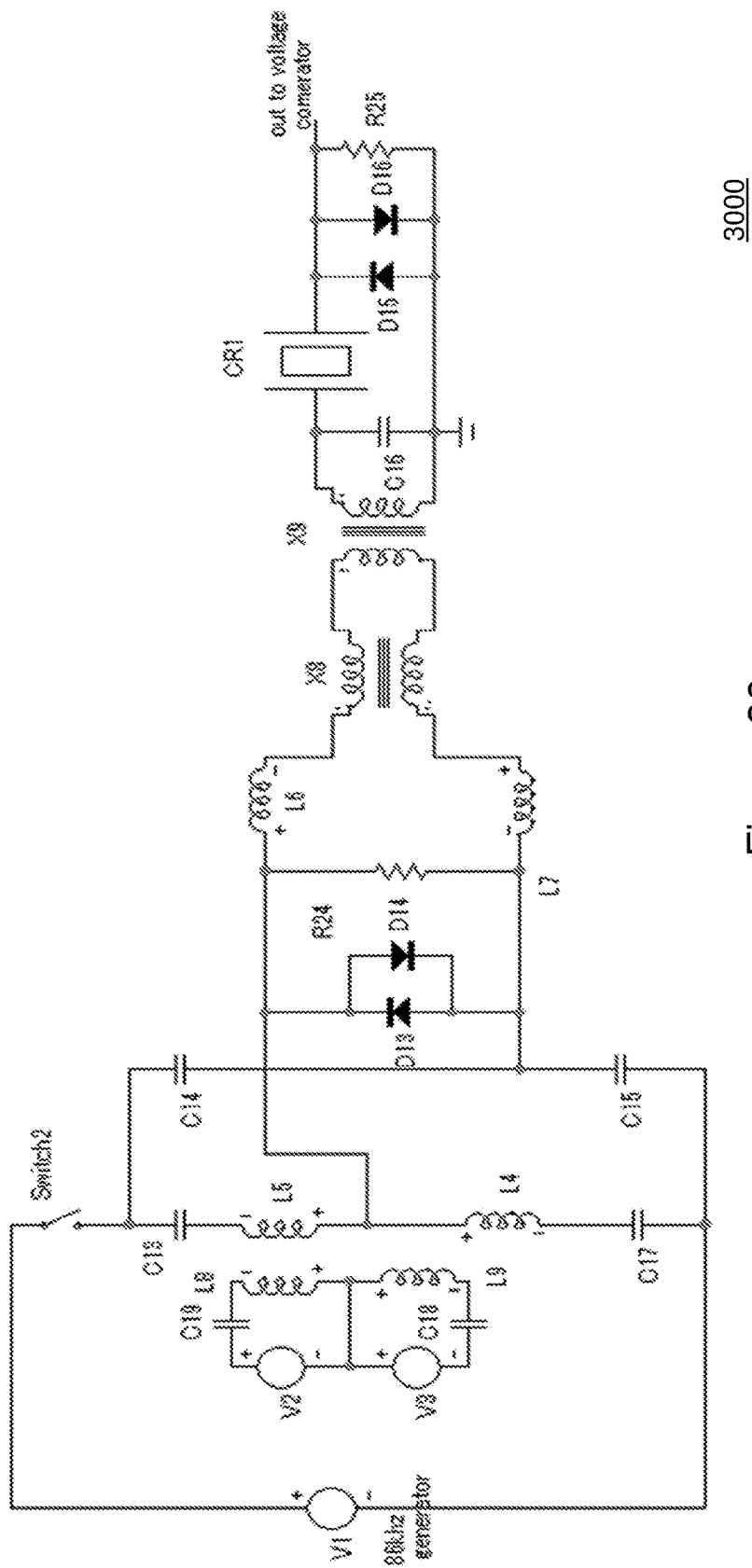
FIG. 30 is a circuit diagram illustrating other aspects relating to the receiver according to some embodiments of the present invention.

FIG. 30 is a circuit diagram illustrating other aspects relating to the communication mode at the receiver according to some embodiments of the present invention. Circuit 3000 includes voltage generator V1 which generates the main frequency of ~86 KHz for the resonance at the power transmit segment. Switch 2 represents the main switch for activating the power transmit segment. Coils L5 and L6 represent the two coils (in opposite phases) of the power transmit segment. Capacitors C13 and C17 represent the resonance capacitors of the resonance frequency of the power transmit segment. Coils L8 and L9 represent the communication transmit antennas (on the vehicle) on the communication frequency (hundreds of KHz). Capacitors C18 and C19 represent the resonance capacitors of the transmitter (vehicle side) operating at the communication frequency. Capacitors C14 and C15 represent the resonance capacitors of the communication receiver (road side) operating at the communication frequency. It is noted that while L4 and L5 serve as both power transmit antennas and communication receive antennas (for saving cost of copper along the power transmission line), it is preferred to use other coils (e.g., L8 and L9) as antennas for transmitting communication at the vehicle side from those used for power receipt at the vehicle side.

In operation, v2 and v3 which operate the communication transmitter at the vehicle side do not work simultaneously. The resonance current of C14, C13 via coil L5 as well as resonance current of C14, C17 via coil L4 always flows via resistor R24. The alternating operation of coils L8 and L9 guarantees an imbalance between the two coils on the segment (so they will not cancel each other being in opposite phases). Thus, there will always be a voltage drop over resistor R24 irrespective of the location of antennas L8 and L9, relative to coils L5 and L4 of the power transmitter segment. In addition to the above, in a case that the switch is set to "ON", there will be no communication in the circuit.

The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

The invention claimed is:

1. A system for wirelessly powering on-road vehicles, the system comprising:
   a plurality of base stations configured to output an alternating current at a specified frequency;
   a power line located beneath a surface of a road and comprising a plurality of independently switched power transmitting segments each comprising at least one pair of coils connected electrically in series to at least one capacitor electrically and via a switch to one of the base stations, forming a switched power transmission inductance circuitry; and
   at least one vehicle having at least one power receiving segment having at least two coils and at least one capacitor forming a power receiving inductance circuitry,
   wherein the at least one vehicle further comprises a communication transmitter configured to transmit a power requesting signal,
   wherein the coils of the power transmitting segment are configured to receive said power requesting signal;
   wherein the base station associated with the coils of the power transmitting segment receiving said power requesting signal is further configured to feed said power transmitting segment with the alternating current at the specified frequency being a resonance frequency of said power transmission and receiving inductance circuitries, responsive to the power requesting signal;
   wherein the power requesting signal is detected by a current loop at a switch card associated with the base station, wherein upon detection of a current at the current loop, and subject to authorization by the base station, the base station feeds the coils at the power transmitting segment.

2. The system according to claim 1, wherein the coils of each pair of coils at the power transmitting segment are operating in opposite phases.

3. The system according to claim 2, wherein the communication transmitter at the vehicle comprises at least two coils transmitting in a mutual exclusive manner so as to ensure a non-zero signal at the opposite phase coils of the power transmitting segment serving as communication receiving circuit.

4. The system according to claim 1, wherein the power request signal sent by the vehicle is only detected whenever there is at least a partial overlap between the coils of the power transmit segment and the coils at the power receive segment.

5. The system according to claim 1, wherein the power request signal is configured to generate an alternating current at the current loop, and wherein the detection is carried out by phase detection.

6. The system according to claim 1, wherein the resonance frequency is approximately 80 kHz to 100 kHz and wherein the power request signal is at a frequency of approximately 400 kHz to 1000 khz.

7. The system according to claim 1, wherein vehicle further comprises auxiliary power receiving segments on both sides of the power receiving segment.

8. The system according to claim 7, wherein the auxiliary power receiving segments comprises oval or rectangular coils.

9. The system according to claim 1, wherein the vehicle further comprises an electrical motor and an impendence matching circuitry configured to receive the current from the power receiving inductance circuitry and deliver an impedance-matched current to the electrical motor.

10. The system according to claim 9, wherein the vehicle further comprises a super capacitor wherein the impendence matching circuitry deliver the impedance-matched current to an electrical motor via the super capacitor.

11. The system according to claim 9, wherein the vehicle further comprises a voltage regulator that prevents an output voltage at the electrical motor from exceeding a predefined value.

12. The system according to claim 11, wherein the voltage regulator comprises a circuit that senses a reference voltage over a predefined value and repeatedly discharges at least one capacitor until the reference voltage goes under the predefined value.

13. The system according to claim 1, wherein the vehicle is further reconfigured to generate a power delivery signal responsive to which, the resonance circuitry at the vehicle transmits power to the resonance circuitry at the power transmission line and onto the base stations, in case the vehicle generates electricity.

\* \* \* \* \*